(12) United States Patent
Oyu

(10) Patent No.: US 8,618,602 B2
(45) Date of Patent: Dec. 31, 2013

(54) SEMICONDUCTOR DEVICE AND METHOD OF FORMING THE SAME

(75) Inventor: Kiyonori Oyu, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 13/331,953

(22) Filed: Dec. 20, 2011

(65) Prior Publication Data

US 2012/0161227 A1 Jun. 28, 2012

(30) Foreign Application Priority Data

Dec. 22, 2010 (JP) ................................. 2010-286647

(51) Int. Cl.
*H01L 29/66* (2006.01)

(52) U.S. Cl.
USPC ........... 257/330; 257/255; 257/329; 257/774; 257/392; 257/E29.262; 257/E29.002; 257/E27.081; 257/E29.256; 257/E21.624; 438/425; 438/272; 438/700; 438/585; 438/270

(58) Field of Classification Search
USPC ................... 257/E27.091, E27.092, E21.409, 257/E29.255, E21.382, 302, 328, 330–333
See application file for complete search history.

(56) References Cited

U.S. PATENT DOCUMENTS

| | | | |
|---|---|---|---|
| 2003/0183941 A1* | 10/2003 | Yamada et al. | 257/774 |
| 2004/0173812 A1* | 9/2004 | Currie et al. | 257/103 |
| 2005/0020086 A1* | 1/2005 | Kim et al. | 438/700 |
| 2007/0148934 A1* | 6/2007 | Cho et al. | 438/585 |
| 2009/0057778 A1* | 3/2009 | Dreeskornfeld et al. | 257/392 |
| 2009/0291541 A1* | 11/2009 | Jang et al. | 438/270 |

FOREIGN PATENT DOCUMENTS

| | | |
|---|---|---|
| JP | 2001-210801 A | 8/2001 |
| JP | 2010-141107 A | 6/2010 |

* cited by examiner

Primary Examiner — Jerome Jackson, Jr.
Assistant Examiner — Bo Fan
(74) Attorney, Agent, or Firm — Sughrue Mion, PLLC

(57) ABSTRACT

A semiconductor device may include, but is not limited to, a semiconductor substrate, a word line, and an isolation region. The semiconductor substrate has an active region and first and second grooves. Each of the first and second grooves extends across the active region. The first groove is wider in width than the second groove. The word line is disposed in the first groove. The isolation region is disposed in the second groove. The isolation region is narrower in width than the word line.

18 Claims, 20 Drawing Sheets

SEMICONDUCTOR DEVICE AND METHOD OF FORMING THE SAME

BACKGROUND OF THE INVENTION

1. Field of the Invention

The present invention generally relates to a semiconductor device and a method of forming the same.

Priority is claimed on Japanese Patent Application No. 2010-286647, filed Dec. 22, 2010, the content of which is incorporated herein by reference.

2. Description of the Related Art

In recent years, with the rapidly shrinking of the element sizes in DRAMs (dynamic random-access memories) and the like, the gate length in MOS transistors has become shorter. With the integration of a large number of MOS transistors into a memory cell region, the distance between adjacent MOS transistors also has been shortened. The shorter the gate length becomes, the greater is the problem of a worsening of transistor characteristics caused by the short-channel effect in the MOS transistors.

One proposed method for suppressing this type of MOS transistor short-channel effect is that of a buried-gate MOS transistor. According to a buried-gate MOS transistor, it is possible to physically and sufficiently achieve an effective channel length (gate length) and implement a microfine DRAM having a minimum process dimension of 60 nm or smaller.

In a buried-gate MOS transistor, a gate electrode (word line) is formed so as to be buried within a trench provided in a semiconductor substrate with an intervening gate insulating film, and the upper surface of the word line is formed so that it is at a position (lower-surface side) in the trench that is deeper than the upper surface of the semiconductor substrate. Also, an impurity diffusion layer is formed on one side of the word line and also on the other side thereof, this functioning as the source region or the drain region of the MOS transistor. By this constitution, if a drain voltage is applied to one of the impurity diffusion layers and the on potential is applied to the word line while maintaining the voltage on the other impurity diffusion, a channel is formed in the area peripheral to the word line within the semiconductor substrate, and the MOS transistor operates. These are disclosed in Japanese Patent Application Publication No. JPA 2001-210801.

A method for forming a word line (element separation region) for element separation that has the same structure as the word line of a MOS transistor is also known in Japanese Patent Application Publication No. JPA 2010-141170. According to a MOS transistor having this type of structure, because it is possible to achieve fine element separation, it is possible to implement a semiconductor device with a high level of integration.

SUMMARY

In an embodiment, a semiconductor device may include, but is not limited to, a semiconductor substrate, a word line, and an isolation region. The semiconductor substrate has an active region and first and second grooves. Each of the first and second grooves extends across the active region. The first groove is wider in width than the second groove. The word line is disposed in the first groove. The isolation region is disposed in the second groove. The isolation region is narrower in width than the word line.

In another embodiment, a semiconductor device may include, but is not limited to, a semiconductor substrate having an active region and an isolation region, the isolation region extending across the active region; and a word line in the semiconductor substrate, the word line extending across the active region, the word line being wider in width than the isolation region.

In still another embodiment, a semiconductor device may include, but is not limited to, a semiconductor substrate, a diffusion region, and a word line. The semiconductor substrate has a plurality of active regions, a word groove and an isolation groove. Each of the word groove and the isolation groove extends across the plurality of active regions. The word groove is wider in width than the isolation groove. The diffusion region is disposed in the active region. The diffusion region is disposed between the first and second grooves. The diffusion region is adjacent to the first and second grooves. The word line is disposed in the word groove. The word line may include, but is not limited to, a first insulating film covering inside walls of the first groove; and a first conductive film in the first groove. The first conductive film is separated by the first insulating film from the semiconductor substrate. The first conductive film is disposed in the first groove. The first conductive film is separated by the first insulating film from the semiconductor substrate. The first conductive film is disposed in the first groove. The first conductive film is separated by the first insulating film from the semiconductor substrate. The isolation region is disposed in the second groove, the isolation region being narrower in width than the word line. The isolation region may include, but is not limited to, a second insulating film and a second conductive film. The second insulating film covers inside walls of the second groove. The second insulating film is made of a same insulating material as the first insulating material. The second conductive film is disposed in the second groove. The second conductive film is separated by the second insulating film from the semiconductor substrate. The second conductive film is narrower in width than the first conductive film.

In yet another embodiment, a method of forming a semiconductor device may include, but is not limited to, the following processes. First and second grooves are formed in a semiconductor substrate. The second groove is narrower in width than the first groove. The first and second grooves are filled with gate insulating films and conductive films to form a word line in the first groove and an isolation region in the second groove.

BRIEF DESCRIPTION OF THE DRAWINGS

The above features and advantages of the present invention will be more apparent from the following description of certain embodiments taken in conjunction with the accompanying drawings, in which.

DETAILED DESCRIPTIONS

Figure 1:
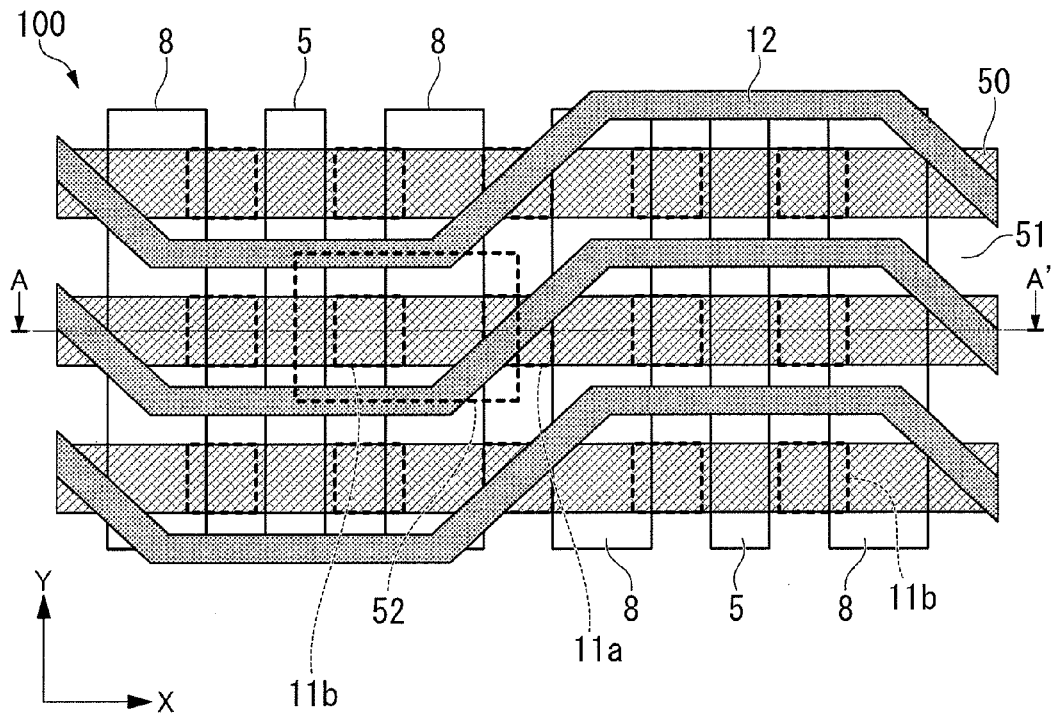
FIG. 1 is a fragmentary plan view of a semiconductor device in accordance with an embodiment of the present invention.

Before describing the present invention, the related art will be explained, in order to facilitate the understanding of the present invention.

In a semiconductor device in the structure of a word line of a MOS transistor and the structure of a word line for element separation are the same, the widths of the word line and the word line for element separation region are formed to be the same. For this reason, with the shrinking of the size of the MOS transistor, there is an accompanying shrinking of the word line, similar to the element separation region.

For this reason, the curvature of the lower surface of the word line becomes small with a shrinking of the size of the MOS transistor, and the subthreshold coefficient of the MOS transistor increases. For this reason, if an attempt is made to achieve the desired off current, it becomes difficult to achieve a sufficient on current, and it is not possible to perform sufficient writing of information in the cell capacitor. Also, with a shrinking of the word line, because the MOS transistor capacitance decreases, the current driving capacity of the MOS transistor decreases.

Also, with the shrinking of the size of the word line for element separation, the ability to separate elements between MOS transistors decreases. For this reason, there is a tendency toward information interference between adjacent MOS transistors, and a worsening of the information holding characteristics.

Embodiments of the invention will be now described herein with reference to illustrative embodiments. Those skilled in the art will recognize that many alternative embodiments can be accomplished using the teaching of the embodiments of the present invention and that the invention is not limited to the embodiments illustrated for explanatory purpose.

In an embodiment, a semiconductor device may include, but is not limited to, a semiconductor substrate, a word line, and an isolation region. The semiconductor substrate has an active region and first and second grooves. Each of the first and second grooves extends across the active region. The first groove is wider in width than the second groove. The word line is disposed in the first groove. The isolation region is disposed in the second groove. The isolation region is narrower in width than the word line.

In some cases, the word line may include, but is not limited to, a first insulating film covering inside walls of the first groove; and a first conductive film in the first groove, the first conductive film being separated by the first insulating film from the semiconductor substrate. The isolation region may include, but is not limited to, a second insulating film covering inside walls of the second groove; and a second conductive film in the second groove. The second conductive film is separated by the second insulating film from the semiconductor substrate.

In some cases, the first and second insulating films are made of a same insulating material.

In some cases, the first conductive film is wider in width than the second conductive film.

In some cases, the first and second conductive films are made of the same conductive material.

In some cases, the first groove is shallower in depth than the second groove.

In some cases, the first groove is substantially the same in depth as the second groove.

In some cases, the first and second insulating films have substantially the same thickness as each other.

In some cases, the second insulating film includes a lower portion and an upper portion, the lower portion is substantially the same in thickness as the first insulating film, and the upper portion is greater in thickness than the lower portion and the first insulating film.

In some cases, the second conductive film is deeper in its top surface level than the first conductive film.

In some cases, the semiconductor device further may include, but is not limited to, a diffusion region in the active region, the diffusion region being between the first and second grooves. The top surface level of the second conductive film is deeper than a bottom surface level of the diffusion region.

In some cases, the top surface level of the second conductive film is deeper by at least 20 nm than the bottom surface level of the diffusion region.

In some cases, the second conductive film has a top surface which has a first depth from a top surface of the semiconductor substrate. The second conductive film has a bottom surface which has a second depth from the top surface of the semiconductor substrate. The first depth is at most 0.8 times of the second depth.

In some cases, the second conductive film is substantially the same in its top surface level as the first conductive film.

In some cases, the semiconductor device further may include, but is not limited to, a diffusion region in the active region, the diffusion region being between the first and second grooves. The top surface levels of the first and second conductive film are shallower than a bottom surface level of the diffusion region.

In another embodiment, a semiconductor device may include, but is not limited to, a semiconductor substrate having an active region and an isolation region, the isolation region extending across the active region; and a word line in the semiconductor substrate, the word line extending across the active region, the word line being wider in width than the isolation region.

In still another embodiment, a semiconductor device may include, but is not limited to, a semiconductor substrate, a diffusion region, and a word line. The semiconductor substrate has a plurality of active regions, a word groove and an isolation groove. Each of the word groove and the isolation groove extends across the plurality of active regions. The word groove is wider in width than the isolation groove. The diffusion region is disposed in the active region. The diffusion region is disposed between the first and second grooves. The diffusion region is adjacent to the first and second grooves. The word line is disposed in the word groove. The word line may include, but is not limited to, a first insulating film covering inside walls of the first groove; and a first conductive film in the first groove. The first conductive film is separated by the first insulating film from the semiconductor substrate. The first conductive film is disposed in the first groove. The first conductive film is separated by the first insulating film from the semiconductor substrate. The first conductive film is disposed in the first groove. The first conductive film is separated by the first insulating film from the semiconductor substrate. The isolation region is disposed in the second groove, the isolation region being narrower in width than the word line. The isolation region may include, but is not limited to, a second insulating film and a second conductive film. The second insulating film covers inside walls of the second groove. The second insulating film is made of a same insulating material as the first insulating material. The second conductive film is disposed in the second groove. The second conductive film is separated by the second insulating film from the semiconductor substrate. The second conductive film is narrower in width than the first conductive film.

In some cases, the first groove is shallower in depth than the second groove.

In some cases, the second insulating film includes a lower portion and an upper portion. The lower portion is substantially the same in thickness as the first insulating film. The upper portion is greater in thickness than the lower portion and the first insulating film.

In some cases, the second conductive film has a top surface which is deeper than the first conductive film and a bottom surface of the diffusion region.

In yet another embodiment, a method of forming a semiconductor device may include, but is not limited to, the following processes. First and second grooves are formed in a semiconductor substrate. The second groove is narrower in width than the first groove. The first and second grooves are filled with gate insulating films and conductive films to form a word line in the first groove and an isolation region in the second groove.

In some cases, a third groove is formed in the semiconductor substrate before making the third groove deeper to form the second groove while the first groove is formed, so that the second groove is deeper than the first groove.

In some cases, an upper gate insulating film is formed which covers the third groove before forming the first and second grooves. Gate insulating films are formed which cover inside wall surfaces of the first and second grooves, while making the upper gate insulating film thicker than the gate insulating films.

In some cases, the first and second grooves are filled with the gate insulating films and the conductive films before the conductive film in the second groove is etched back so that the upper surface of the conductive film in the second groove is deeper than the upper surface of the conductive film in the first groove.

In some cases, after the first and second grooves are formed, pillars are formed between the two adjacent first grooves and between the first and second grooves, before forming diffusion layers in upper portions of the pillars. After that, an etch-back process is carried out so that the upper surface of the conductive film in the second groove is deeper than the bottom surface of the diffusion layer. In other cases, instead of or in combination with the etch-back process, the diffusion layer is formed so that the upper surface of the conductive film in the second groove is deeper than the bottom surface of the diffusion layer.

In some cases, after the first and second grooves are formed, pillars are formed between the two adjacent first grooves and between the first and second grooves, before forming diffusion layers in upper portions of the pillars. After that, an etch-back process is carried out so that the upper surface of the conductive film in the second groove is deeper by at least 20 nm than the bottom surface of the diffusion layer. In other cases, instead of or in combination with the etch-back process, the diffusion layer is formed so that the upper surface of the conductive film in the second groove is deeper by at least 20 nm than the bottom surface of the diffusion layer.

In some cases, after the first and second grooves are formed, pillars are formed between the two adjacent first grooves and between the first and second grooves, before forming diffusion layers in upper portions of the pillars. After that, an etch-back process is carried out so that a first depth of a top surface of the conductive film in the second groove is at most 0.8 times of a second depth of a top surface of the conductive film in the second groove.

Embodiments:

An illustrative embodiment of a semiconductor device, which is an embodiment applying the present invention, will be described below with references made to the drawings. In the present embodiment, the description is for the case in which the present invention is applied to a DRAM (dynamic random-access memory) as an example of semiconductor device. In the drawings referenced in the description that follows, there are cases in which, for the purpose of ease of understanding, characteristic parts are shown enlarged, and the dimensional ratios and the like of various constituent elements are not necessarily the same as in actuality. Also, the raw materials and dimensions and the like given as examples in the description to follow are only examples, and do not restrict the present invention, which may be embodied with to appropriate changes within a scope that does not change the spirit of the present invention.

First, the constitution of a semiconductor device (DRAM) 100 which is a first embodiment applying the present invention will be described. The semiconductor device 100 of the present embodiment is constituted by a memory cell region shown in FIG. 1, and by a non-illustrated peripheral circuit region.

A memory cell that constitutes the semiconductor device 100, which is the first embodiment, will be described below, using FIG. 1 and FIG. 2.

First, the general constitution of the memory cell in the semiconductor device 100 will be described, using FIG. 1.

As shown in FIG. 1, in the memory cell of the semiconductor device 100, bit lines 12 are provided to extend in the X direction in the manner of piece-wise linear curves, which are disposed so as to be separated from one another by a prescribed spacing in the Y direction.

Linearly shaped first element separation regions 51 made of an insulator are provided so as to extend in the X direction. The linearly shaped active regions 50 that are partitioned by the first element separation regions 51 are separated by a prescribed spacing.

Word lines 8 and second element separation regions 5 are provided so as to extend in a direction (Y direction as shown in FIG. 1) that is perpendicular to the active regions 50. Although the word lines 8 and the second element separation regions 5 shown in FIG. 1 are formed so as to be perpendicular to the active regions 50, they may be formed so as to intersect therewith at an inclination. The word lines 8, the second element separation regions 5, and the active regions 50 should not be restricted to the shape and arrangement thereof shown in FIG. 1, and these may be shapes and arrangements that are applied in to other general type transistors.

The region 52, which is a region in which the active region 50 and the word line 8 intersect, is taken to be the region of one bit.

The width of a word line 8 is formed so as to be larger than the width of the second element separation region 5. The second element separation regions 5 functions as an element separation region between adjacent transistors, and the word line 8 functions as the gate electrode of a memory cell.

First contact plugs 11a are formed between word lines 8 and in regions of intersections with the active regions 50. Second contact plugs 11b are formed between the word lines 8 and the second element separation region 5 and in the part in which there is intersection with the active region 50.

Next, using FIG. 2, the detailed constitution of the memory cell part of the semiconductor device 100 will be described. FIG. 2 is a cross-sectional view for describing an example of a semiconductor device 100 of the first embodiment, this showing the cross-section along the line A-A' of FIG. 1. The dimensions and the like of various parts shown in these drawings are different from the dimensions and the like in an actual semiconductor device.

Figure 2:
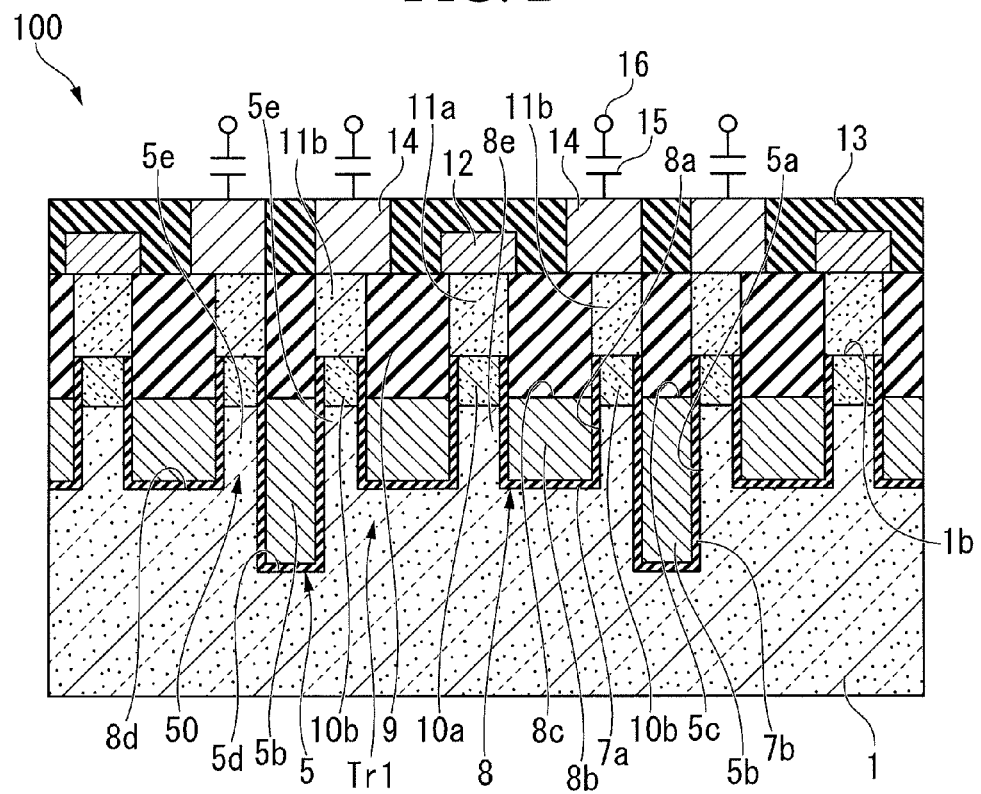
FIG. 2 is a fragmentary cross sectional elevation view, taken along an A-A' line of FIG. 1, of the semiconductor device, in accordance with the embodiment of the present invention.

As shown in FIG. 2, a MOS transistor Tr1, a capacitor 15, and an interconnect 16 are formed in the semiconductor device 100 of the present embodiment. The MOS transistor Tr1 is generally constituted by a semiconductor substrate 1, an active region 50, a word line 8, and a second element separation region 5.

Silicon (Si) that contains a p-type impurity of a prescribed concentration can be used as the semiconductor substrate 1. A first trench 8a and a second trench 5a that is narrower and deeper than the first trench 8a are formed on the upper surface side of the semiconductor substrate 1 with a prescribed spacing. Although the lower surfaces of the first trenches 8a and the second trenches 5a shown in FIG. 2 and thereafter are rectangular, in actuality they have a shape that is a square with rounded corners.

In the semiconductor device 1, active regions 50 are partitioned by the second trenches 5a. A first pillar 8e is formed between adjacent first trenches 8a. A second pillar 5e is provided between adjacent first trenches 8a and second trenches 5a.

The word lines 8 and the second element separation regions 5 are formed so as to uniformly partition the active regions 50.

A word line 8 is formed by burying a conductive layer 8b into a first trench 8a, with an intervening gate insulating film 7a made of, for example, a silicon oxide film. The conductive layer 5b and the conductive layer 8b are constituted by a multilayer film of, for example, metal films. It is possible to use a film laminate made of titanium nitride and tungsten (W) or the like as such a metal film, but there is no restriction to these materials, and a high melting point metal such as tungsten nitride (WN) or tungsten silicide (WSi) or the like can be used.

The upper surface 8c of the conductive layer 8b that forms the word line 8 is positioned at a position that is deeper than the upper surface 1b of the semiconductor substrate 1.

The lower surface 8d of the word line 8 is preferably positioned at a position that is at least 150 nm shallower than the lower surface of the first element separation region 51 shown in FIG. 1.

A first insulating film 9 make of, for example, a silicon oxide film, is formed so as to cover the upper surface 8c and also bury the inside of the first trench 8a. The first insulating film 9 is formed so as to protrude from the upper surface 1b of the semiconductor substrate 1.

The second element separation region 5, with the exception of being formed deeper and having a narrow width than the word line 8, has the same constitution as the word line 8, and is formed so as to bury the conductive layer 5b in the second trench 5a, with an intervening second gate insulating film 7b. The second gate insulating film 7b is formed from the same material as, and simultaneously with, the first gate insulating film 7a.

The upper surface 5c of the conductive layer 5b that forms the second element separation region 5 is positioned at a position that is deeper than the upper surface 1b of the semiconductor substrate 1. The lower surface 5d of the second element separation region 5 is positioned at a position that is deeper than the lower surface 8d of the word line 8.

The lower surface 5d of the second trench 5a is preferably a position that is at least 50 nm shallower than the lower surface of the first element separation region 51 shown in FIG. 1.

The lower surface 5d is preferably positioned at a position that is 20 nm to 100 nm deeper than the lower surface 8d.

The first insulating film 9 is formed so as to cover the upper surface 5c of the conductive layer 5b and also so as to bury the inside of the second trench 5a.

The first impurity diffusion layer 10a and the second impurity diffusion layer 10b are formed, for example, by the diffusion of an n-type impurity such as phosphorus into the upper parts of the first pillar 8e and the second pillar 5e, respectively. The first impurity diffusion layer 10a and the second impurity diffusion layer 10b function as one of the source region and the drain region of the MOS transistor Tr1.

When the potential difference between the first impurity diffusion layer 10a and the second impurity diffusion layer 10b exceeds a threshold value, the region of the active region 50 that is in contact with the word line 8 via the first gate insulating film 7a functions as the channel region of the MOS transistor Tr1.

The first contact plug 11a and the second contact plug 11b are made of, for example, polysilicon containing phosphorus, and are formed so as to pass through the first insulating film 9.

The first contact plug 11a is formed so that it is connected to the first impurity diffusion layer 10a, and the second impurity diffusion layer 11b is formed so that it is connected to the second impurity diffusion layer 10b.

The bit line 12 is formed so as to be connected to the first contact plug 11a. The bit line 12 is formed as a film laminate made of, for example, titanium nitride (WN) and tungsten (W).

A second insulating film 13 is formed so as to cover the upper surface side of the bit line 12 and the first insulating film 9. A third contact plug 14 is formed so as to pass through the second insulating film 13 and also so as to be connected to the second contact plug 11b.

The capacitor 15 is formed so as to be connected to the third contact plug 14. The interconnect 16 is formed so as to be connected to the capacitor 15.

According to the semiconductor device 100 of the first embodiment, because the word line 8 is formed so as to be wider than the second element separation region 5, it is possible to prevent a reduction in width of the word line 8 accompanying a shrinking of the size of the MOS transistor Tr1. For this reason, it is possible to obtain a sufficient on current while achieving an off current in the word line 8, thereby suppressing a decrease in the capacitance.

Also, because a reduction in the capacitance of the word line 8 is suppressed, it is possible to prevent a decrease in the current driving capacity of the MOS transistor Tr1.

Also, because the lower surface 5d of the second element separation region 5 is formed to be at a position that is deeper than the lower surface 8d of the word line 8, it is possible to suppress a reduction in element separation capability accompanying a shrinking in the size of the MOS transistor Tr1. For this reason, it is possible to prevent information interference between adjacent MOS transistors Tr1 and to suppress the junction leakage current, and it is possible to prevent a worsening of the information holding characteristics due to the shrinking sizes in the semiconductor device 100.

By the lower surface 8d of the word line 8 being positioned at a position that is at least 150 nm shallower than the lower surface of the first element separation region 51 shown in FIG. 1, it is possible to sufficiently maintain the element separation ability of the first element separation region 51. For this reason, it is possible to prevent information interference between adjacent MOS transistors Tr1.

By the lower surface 5d of the second trench 5a being positioned at a position that is at least 50 nm shallower than the lower surface of the first element separation region 51 shown in FIG. 1, it is possible to prevent the second trench 5a from passing through the first element separation region 51.

By the lower surface 5d being positioned at a position that is 20 nm to 100 nm deeper than the lower surface 8d, it is possible to effectively improve the element separating ability of the second element separation region 5.

Next, one example of a method for manufacturing the semiconductor device 100, which is the first embodiment, will be described, using FIG. 2 to FIG. 18.

The method for manufacturing the semiconductor device 100, which is the first embodiment, generally has a first step of forming a first trench 8a and a second trench 5a in a semiconductor substrate 1, and a second step of forming a word line 8 and a second element separation region 5. Each of the steps is described in detail below.

First, a mask (not shown) that uses photoresist is used on the p-type semiconductor substrate 1 to perform etching, so as to form a recessed part that is not illustrated and that extends in the X direction. Next, by burying an insulating film into the recessed part, a first element separation region 51 and an active region 50 partitioned by the first element separation region 51 are formed.

Figure 3:
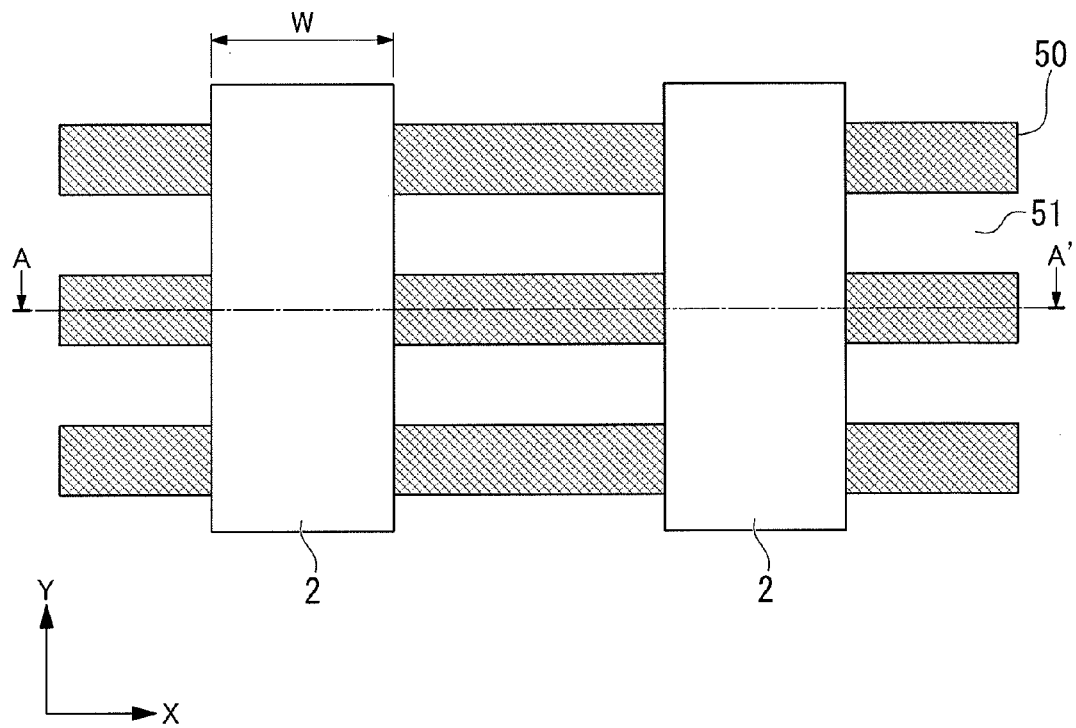
FIG. 3 is a fragmentary plan view of a step involved in a method of forming the semiconductor device of FIGS. 1 and 2.
Figure 4:
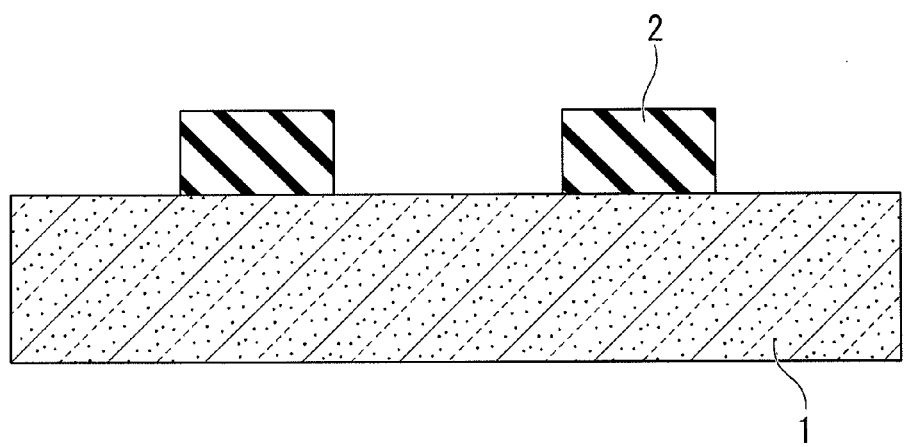
FIG. 4 is a fragmentary cross sectional elevation view, taken along an A-A' line of FIG. 3.

Next, a first sacrificial mask 2 is formed, as shown in FIG. 3 and FIG. 4. FIG. 3 is a schematic plan view for describing the method for manufacturing the semiconductor device 100 and FIG. 4 is a cross-sectional view along the line A-A' of FIG. 3. First, for example, a silicon nitride film having a film thickness of 150 nm is formed so as to cover the semiconductor substrate 1. Next, using the usual lithography and dry etching technologies, a linearly shaped first sacrificial mask 2 is formed that extends in the Y direction and that intersects with the active region 50.

When this is done, the first sacrificial mask 2 is formed so that the spacing between them is 6 times the minimum process dimension and so that the width W thereof is approximately 3.5 times the minimum process dimension.

Figure 5:
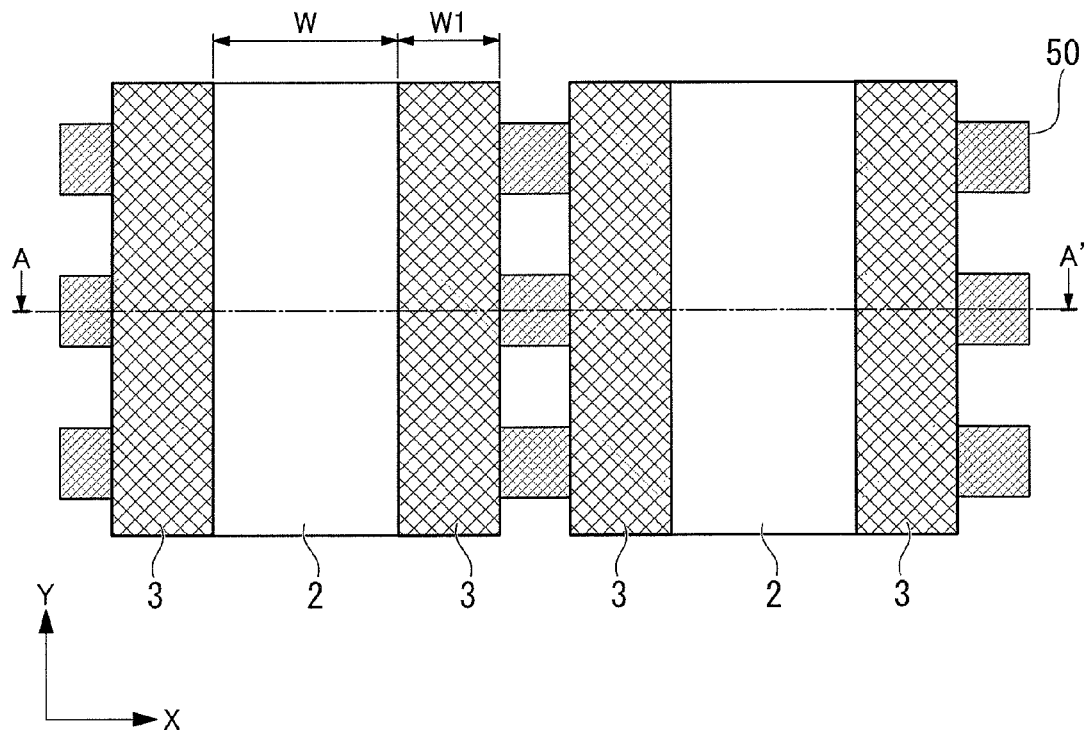
FIG. 5 is a fragmentary plan view of a step involved in a method of forming a semiconductor device in accordance with another embodiment of the present invention.
Figure 6:
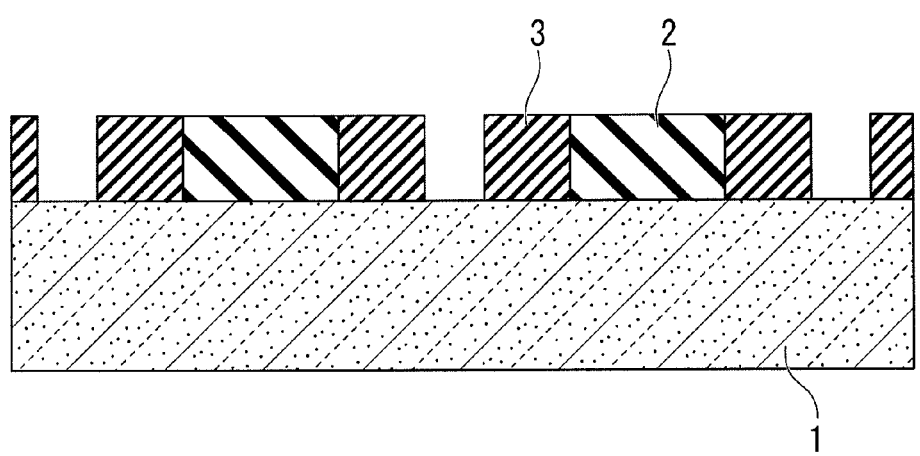
FIG. 6 is a fragmentary cross sectional elevation view of the step, taken along an A-A' line of FIG. 5.

Next, as shown in FIG. 5 and FIG. 6, a second sacrificial mask 3 is formed. First, the usual CVD is used to form a silicon oxide film having a film thickness of approximately 1.3 times the minimum process dimension so as to cover the semiconductor substrate 1. Next, the silicon oxide film is etched into a sidewall shape, thereby forming the second sacrificial mask 3 that extends in the Y direction. When this is done, the width of the second sacrificial mask 3 in the X direction is W1, and control of the width W1 can be done by the thickness of the silicon oxide film.

Figure 7:
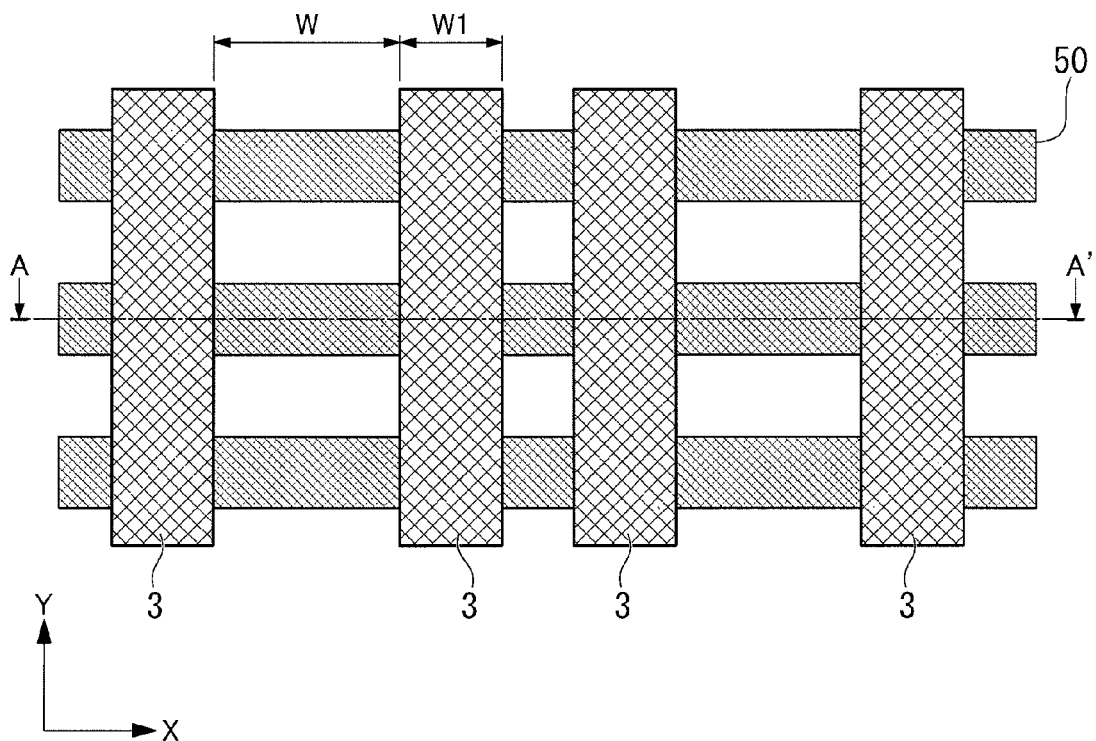
FIG. 7 is a fragmentary plan view of a step, subsequent to the step of FIGS. 5 and 6, involved in the method of forming the semiconductor device in accordance with another embodiment of the present invention.
Figure 8:
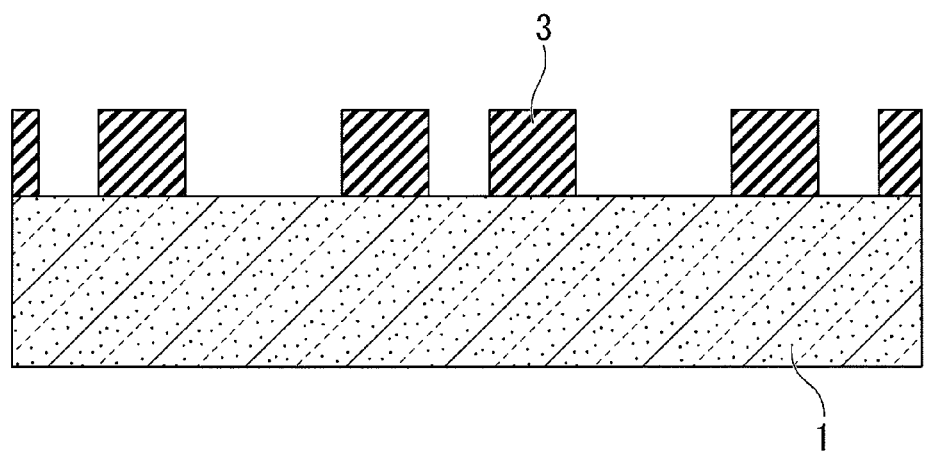
FIG. 8 is a fragmentary cross sectional elevation view of the step, taken along an A-A' line of FIG. 7.

Next, as shown in FIG. 7 and FIG. 8, the first sacrificial mask 2 is selectively removed. By this removal, the pattern of the linearly shaped second sacrificial mask 3 that extends in the Y direction is formed.

Figure 9:
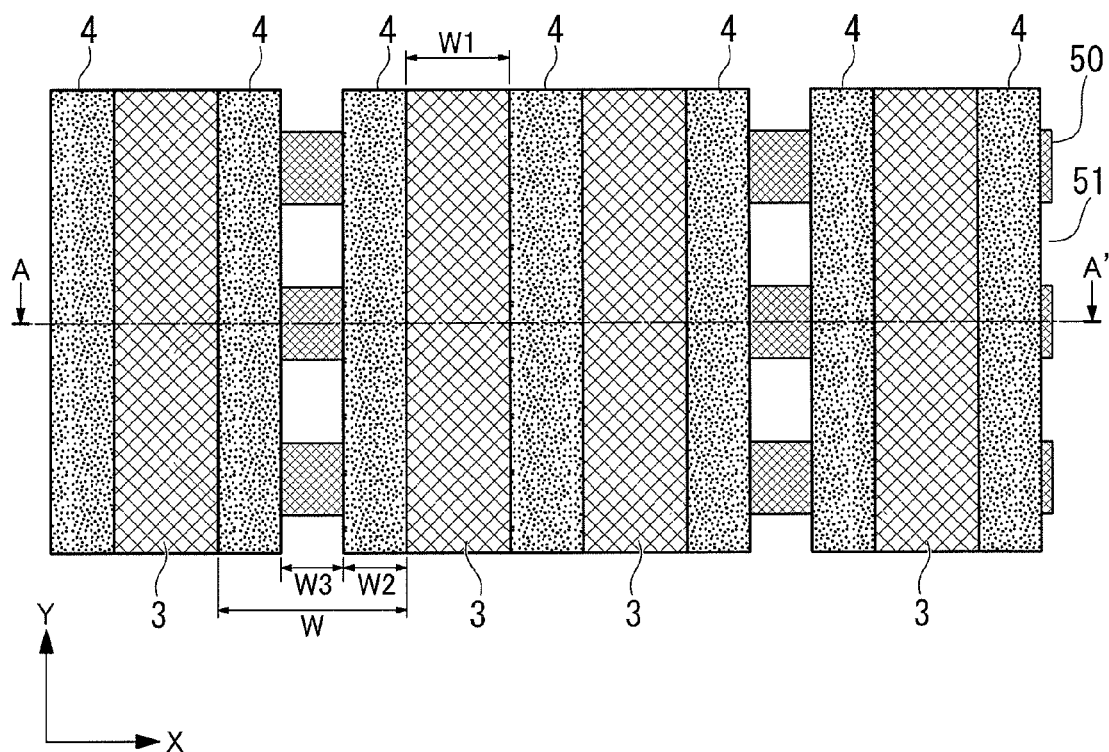
FIG. 9 is a fragmentary plan view of a step, subsequent to the step of FIGS. 7 and 8, involved in the method of forming the semiconductor device in accordance with another embodiment of the present invention.
Figure 10:
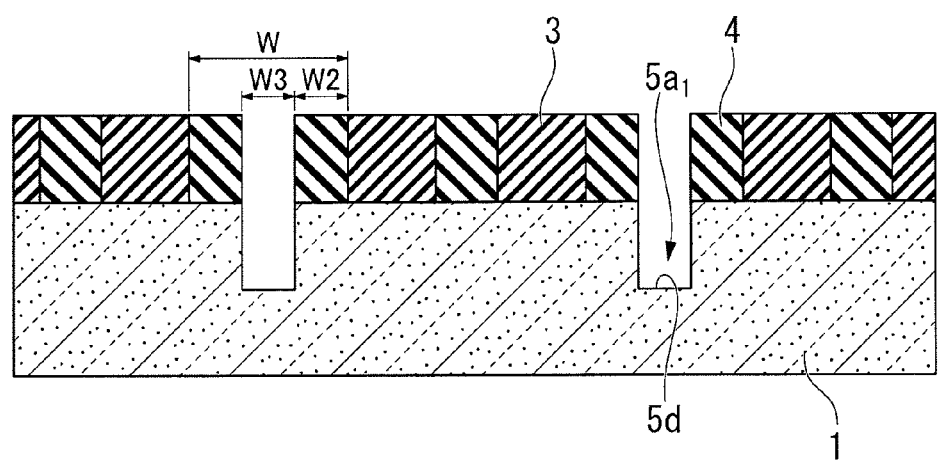
FIG. 10 is a fragmentary cross sectional elevation view of the step, taken along an A-A' line of FIG. 9.

Next, as shown in FIG. 9 and FIG. 10, the second trench upper part $5a_1$ is formed. First, using the usual CVD, a silicon nitride film having a thickness that is approximately 1.2 times the minimum process dimension is formed so as to cover the semiconductor substrate 1. Next, the silicon nitride film is etched into a sidewall shape, thereby forming the third sacrificial mask 4. When this is done, the width of the third sacrificial mask 4 is W2.

Next, the active region 50 and the first element separation region 51 that are exposed in a linear shape are etched. By this etching, the second trench upper part $5a_1$ having a width W3 is formed. When this is done, the sizes of W and W2 are adjusted beforehand so that W3 is smaller than W1. The bottom surface (lower surface) of the second trench upper part $5a_1$ is taken as the lower surface 5d.

Figure 11:
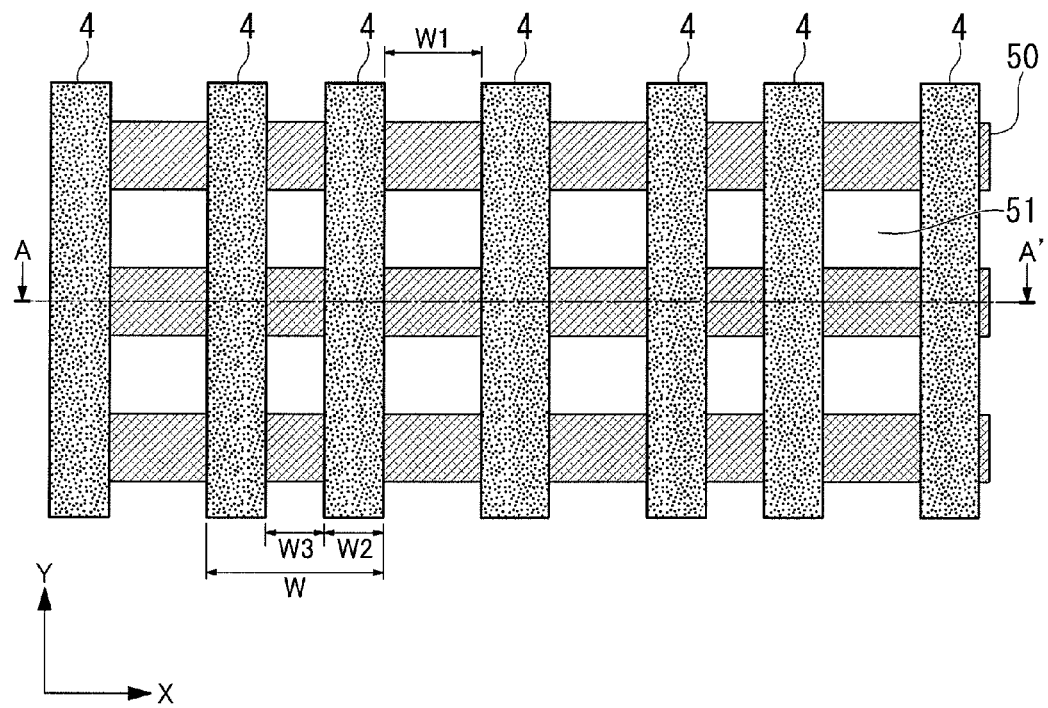
FIG. 11 is a fragmentary plan view of a step, subsequent to the step of FIGS. 9 and 10, involved in the method of forming the semiconductor device in accordance with another embodiment of the present invention.
Figure 12:
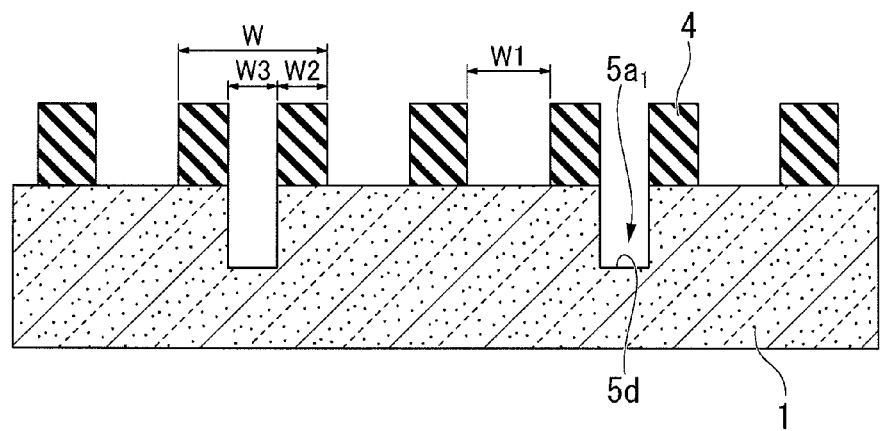
FIG. 12 is a fragmentary cross sectional elevation view of the step, taken along an A-A' line of FIG. 11.

Next, as shown in FIG. 11 and FIG. 12, wet etching using hydrofluoric acid is done to selectively remove the second sacrificial mask 3. By this etching, the locations of the active region 50 and the first element separation region 51 that correspond to the second sacrificial mask 3 are exposed in a linear shape.

Figure 13:
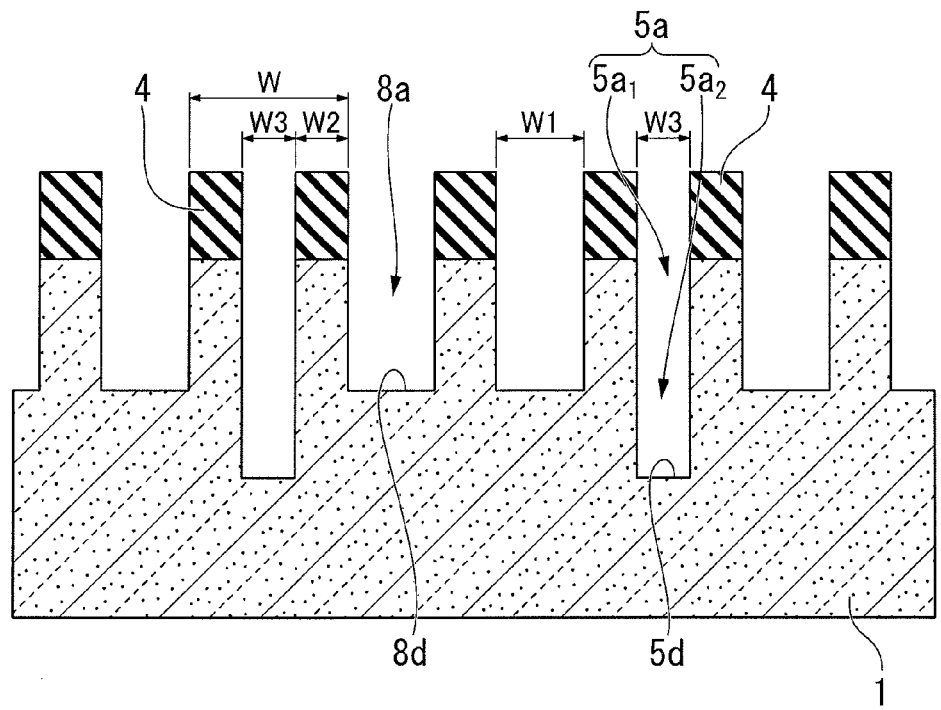
FIG. 13 is a fragmentary cross sectional elevation view of a step, subsequent to the step of FIGS. 11 and 12, involved in the method of forming the semiconductor device in accordance with another embodiment of the present invention.

Next, as shown in FIG. 13, the first trench 8a and second trench lower part $5a_2$ are formed. First, in a region in which the active region 50 and the first element separation region 51 have been exposed by the usual dry etching, a first trench 8a having a width W1 is formed. When this is done, the second trench upper part $5a_1$ is additionally etched simultaneously with the formation of the first trench 8a, so that the bottom surface (lower surface) 5d of the second trench upper part $5a_1$ is etched further downward. The trench at the lower part of the second trench upper part $5a_1$ that is etched downward by this additional etching is taken as the second trench lower part $5a_2$. By the above, a second trench 5a constituted by a second trench upper part $5a_1$ and a second trench lower part $5a_2$ is formed. The lower surface 5d of the second trench 5a is formed so as to be further below the lower surface side than the lower surface 8d of the first trench 8a.

When this is done, the lower surface 8d of the first trench 8a is preferably formed so as to be positioned at a position that is at least 150 nm shallower than the border between the lower surface side of the first element separation region 51 and the semiconductor substrate 1.

It is preferable that the second trench 5a be formed so that the position of the lower surface 5d thereof be adjusted so as not to pass through the first element separation region 51. In particular, it is preferable that the etching conditions be adjusted so that the lower surface 5d is at a position that is at least 50 nm shallower than the lower surface side of the first element separation region 51.

It is preferable that the lower surface 5d be formed so that it is positioned a maximum of 100 nm and a minimum of 20 nm further to the lower surface side, relative to the lower surface 8d.

The size of the width W1 of the first trench 8a is not particularly restricted, and can be a size that is not a problem from the standpoint of a reduction in the current driving capacity of the MOS transistor Tr1. Also, because the width W1 is the same value as the width W1 of the second sacrificial mask 3, it can be controlled by the width of the second sacrificial mask 3 as shown FIG. 9. There is no particular restriction placed on the size of the width W3 of the second trench 5a, as long as it is smaller than W1 and also a value that enables establishment of the width of the first trench 8a, the first contact plug 11a, and the second contact plug 11b. Because the width W3 is W−2×W2, it can be controlled by the width W2 of the third sacrificial mask 4.

Figure 14:
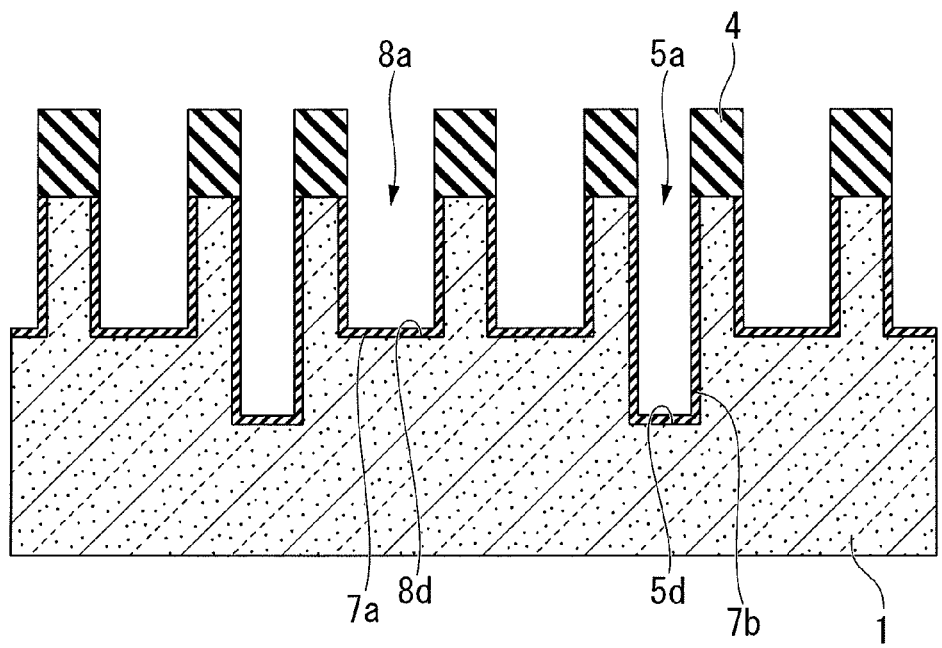
FIG. 14 is a fragmentary cross sectional elevation view of a step, subsequent to the step of FIG. 13, involved in the method of forming the semiconductor device in accordance with another embodiment of the present invention.

Next, as shown in FIG. 14, the usual thermal oxidation method is used to oxidize the inner wall of the second trench 5a and the inner wall of the first trench 8a, thereby forming a thermal oxide film made of a silicon oxide film ($SiO_2$). Of this silicon oxide film, the part that covers the inner wall of the first trench 8a is taken as the first gate insulating film 7a, and the part that covers the inner wall of the second trench 5a is taken as the second gate insulating film 7b.

Figure 15:
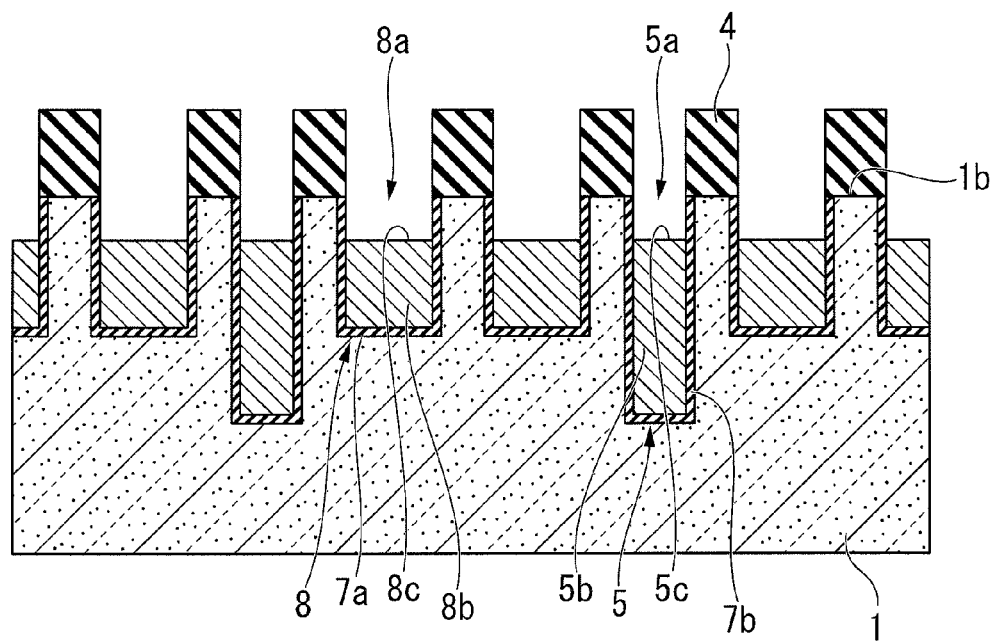
FIG. 15 is a fragmentary cross sectional elevation view of a step, subsequent to the step of FIG. 14, involved in the method of forming the semiconductor device in accordance with another embodiment of the present invention.

Next, as shown in FIG. 15, the word line 8 and the second element separation region 5 are formed. First, a titanium nitride film and a tungsten film are sequentially deposited inside the first trench 8a and inside the second trench 5a to form a conductive layer made of a metal film.

After that, by the usual etching back technology, the conductive layer is etched with the third sacrificial mask 4 as a mask, to form a word line 8 made of a conductive layer 8b buried inside the first trench 8a, with an intervening first gate insulating film 7a, and to form a second element separation region 5 made of the conductive layer 5b buried inside the second trench 5a, with an intervening second gate insulating film 7b.

When etching this conductive layer, the etching conditions are adjusted so that the upper surface 5c of the conductive layer 5b and the upper surface 8c of the conductive layer 8b are positioned, for example, approximately 50 nm on the lower surface side from the upper surface 1b of the semiconductor substrate 1.

Figure 16:
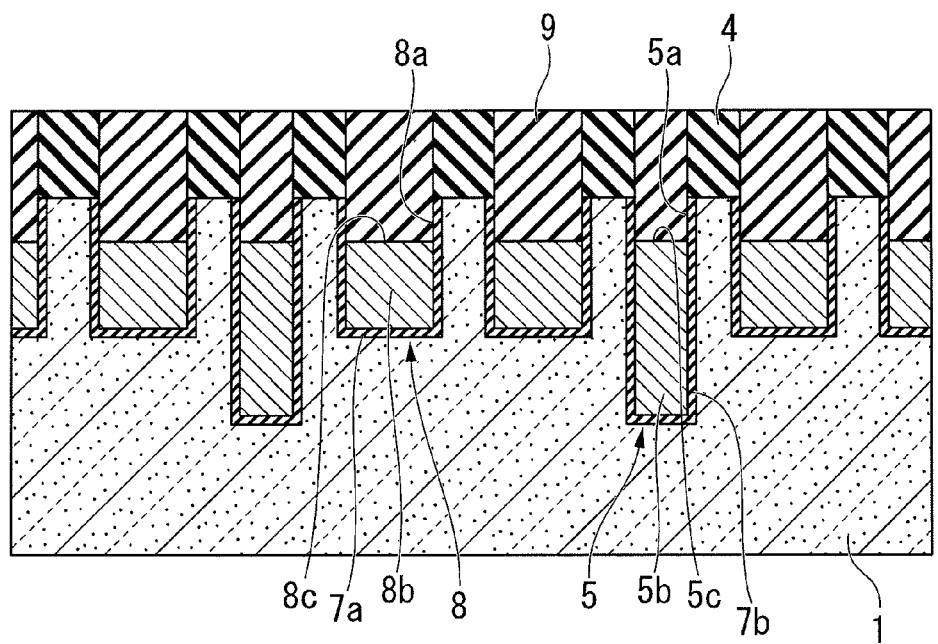
FIG. 16 is a fragmentary cross sectional elevation view of a step, subsequent to the step of FIG. 15, involved in the method of forming the semiconductor device in accordance with another embodiment of the present invention.

Next, as shown in FIG. 16, the first insulating film 9 is formed. First, using plasma CVD, a first insulating film 9 made of, for example, silicon nitride with a film thickness of approximately 60 nm, is deposited so as to bury over the upper surface 8c on the inside of the first trench 8a, and over the upper surface 5c of the conductive layer 5b on the inside of the second trench 5a. Next, CMP is performed to polish the surface of the first insulating film 9 until the third sacrificial mask 4 is exposed.

Figure 17:
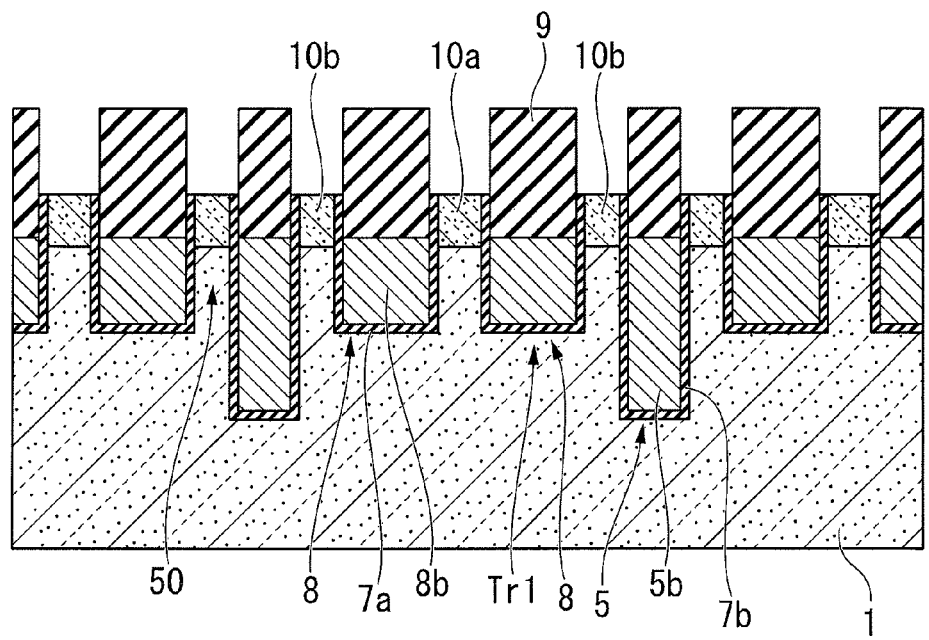
FIG. 17 is a fragmentary cross sectional elevation view of a step, subsequent to the step of FIG. 16, involved in the method of forming the semiconductor device in accordance with another embodiment of the present invention.

Next, as shown in FIG. 17, a first impurity diffusion layer 10a and a second impurity diffusion layer 10b are formed. First, by wet etching using hot phosphoric acid, only the third sacrificial mask 4 is selectively removed, so as to expose the active region 50.

Next, an n-type impurity, such as phosphorus having, for example, a concentration of $2.0 \times 10^{13}/cm^3$ is ion implanted into the surface of the active region 50 with an acceleration energy of 25 keV. Then, heat treatment is done for 10 s at 950° C. so as to cause diffusion of the n-type impurity. By the diffusion of the n-type impurity, an impurity diffusion layers (first impurity diffusion layer 10a and second impurity diffusion layer 10b) are formed in the vicinity of the surface of the active region 50.

Of the impurity diffusion layers, the region between adjacent word lines 8 is taken as the first impurity diffusion layer 10a, and the region between the second element separation region 5 and a word line 8 is taken as the second impurity diffusion layer 10b. By the above, the MOS transistor Tr1 is formed.

The first impurity diffusion layer 10a functions as one of either the source region or the drain region of the MOS transistor Tr1, and the second impurity diffusion layer 10b function as the other of either the source region of drain region of the MOS transistor Tr1.

Figure 18:
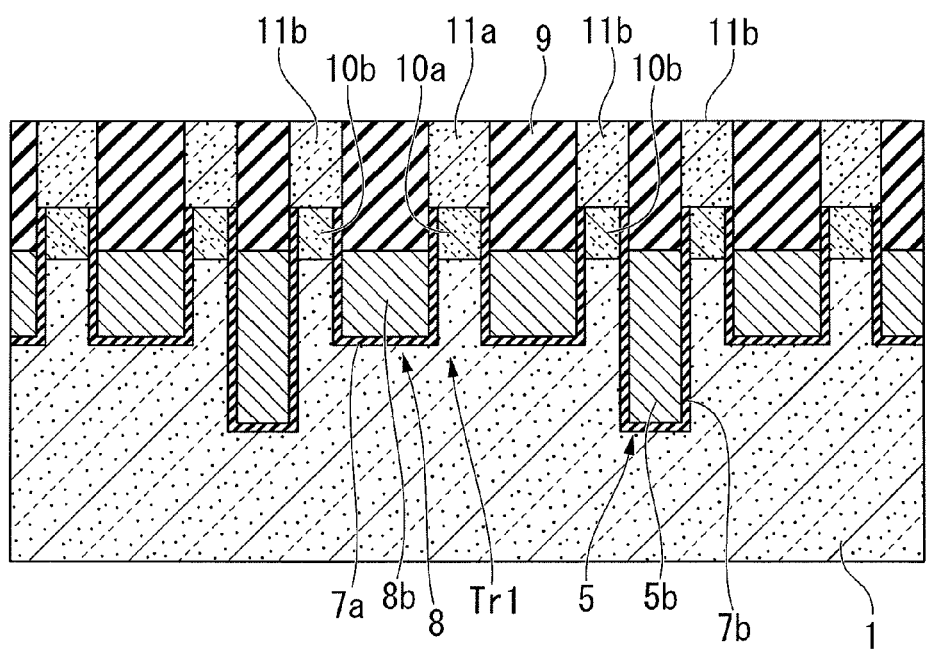
FIG. 18 is a fragmentary cross sectional elevation view of a step, subsequent to the step of FIG. 17, involved in the method of forming the semiconductor device in accordance with another embodiment of the present invention.

Next, the first contact plug 11a and the second contact plug 11b are formed, as shown in FIG. 18. First, by usual technique for selective epitaxial growth, an epitaxy layer is grown over the first impurity diffusion layer 10a and over the second impurity diffusion layer 10b.

Next, an impurity such as arsenic is introduced into the epitaxial layer. By doing this, the first contact plug 11a that makes connection to the first impurity diffusion layer 10a and the second contact plug 11b that makes connection to the second impurity diffusion layer 10b are formed.

After that, as shown in FIG. 2, the bit lines 12, the second insulating film 13, the third contact plugs 14, the capacitors 15, and the interconnects 16 are sequentially formed. The above process steps manufacture the semiconductor device 100 of the present embodiment of the present invention.

According to the method for manufacturing the semiconductor device 100 of the first embodiment, by forming a second element separation regions 5 and a word lines 8 that have a width that is greater than that of the second element separation regions 5, it is possible to prevent a reduction in the curvature of the lower surface 8d of the word lines 8 and an increase in the subthreshold coefficient. For this reason, it is possible to obtain a sufficient on current in the word lines 8, and to sufficiently write information into the cell capacitors. Also, because a reduction in the capacitance of the word lines 8 is prevented, it is possible to prevent a reduction in the current driving capacity of the MOS transistor Tr1.

Also, by positioning the lower surface 5d of the second element separation region 5 at a position that is deeper than the lower surface 8d of the word line 8, it is possible to suppress a reduction in the element separating ability in the MOS transistor Tr1. It is therefore possible to prevent information interference between adjacent MOS transistors Tr1, and possible to suppress the junction leakage current.

Also, by positioning the lower surface 5d of the second trench 5a at a position that is at least 50 nm shallower than the lower surface side of the first element separation region 51, it is possible to cause the first element separation region 51 to remain with a thickness of at least 150 nm beneath the lower surface 8d. For this reason, it is possible to prevent a decrease in the element separation ability of the first element separation region 51, and also possible to prevent information interference between adjacent MOS transistors Tr1.

By positioning the lower surface 5d a maximum of approximately 100 nm and a minimum of approximately 20 nm from the lower surface 8d, it is possible to improve the element separation ability effect of the second element separation region 5.

By forming the lower surface 8d of the first trench 8a so that it is at least 150 nm toward the upper surface side from the boundary between the lower surface side of the first element separation region 51 and the semiconductor substrate 1, it is possible to cause the first element separation trench 51 to remain with a thickness of at least 150 nm beneath the lower surface side of the lower surface 8d. For this reason, it is possible to prevent a decrease in the element separation ability of the word line 8, without reducing the element separation ability of the first element separation region 51. For this reason, it is possible to prevent information interference between adjacent MOS transistors Tr1.

By the above, it is possible to prevent information interference between adjacent MOS transistors Tr1 and also possible to improve the information holding characteristics thereof. For this reason, it is possible to suppress the junction leakage current in the MOS transistor Tr1, and to prevent a worsening of the information holding characteristics due to the shrinking sizes in the semiconductor device 100 (DRAM).

Figure 19:
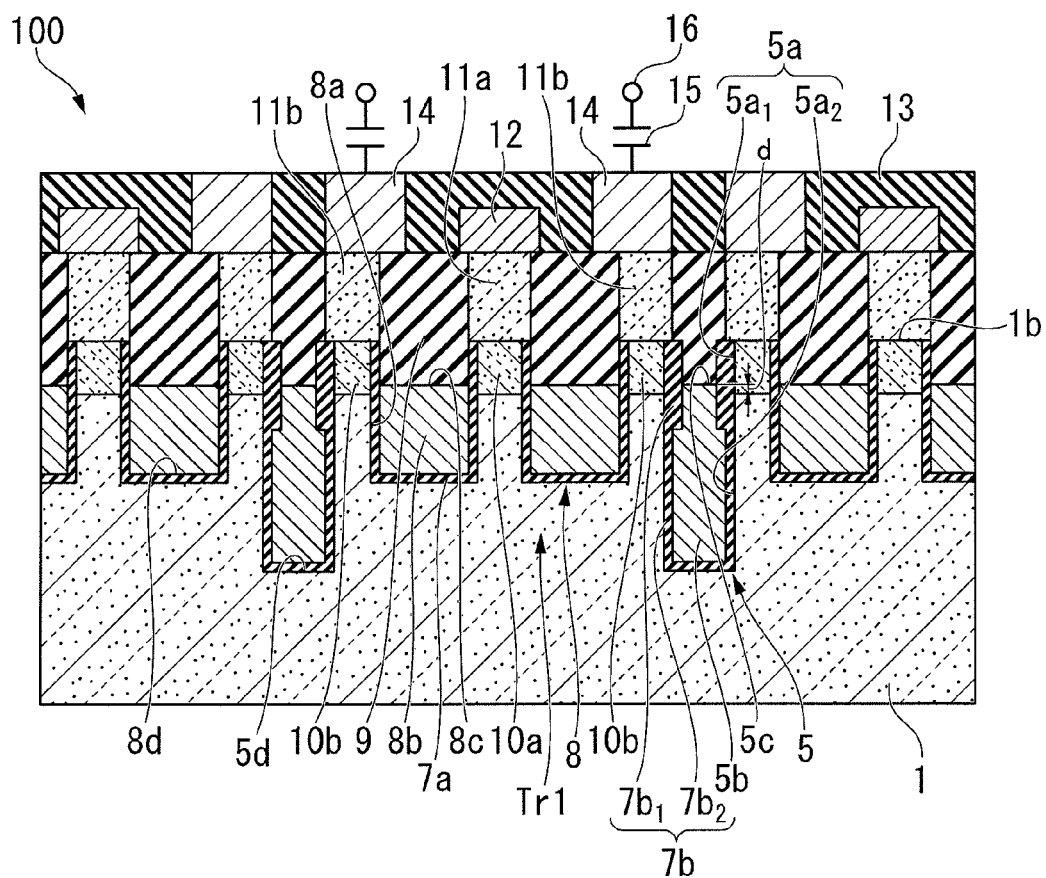
FIG. 19 is a fragmentary cross sectional elevation view of a step, subsequent to the step of FIG. 18, involved in the method of forming the semiconductor device in accordance with another embodiment of the present invention.

A second embodiment of the semiconductor device 100 will be described, using FIG. 19. FIG. 19 is a cross-sectional view for describing the semiconductor device 100 of the second embodiment, this showing the cross-section along the line A-A' in FIG. 1. The semiconductor device 100 of the second embodiment is different from the semiconductor device 100 of the first embodiment with regard to the point of the upper part of the second gate insulating film 7b (the second gate insulating film upper part $7b_1$) being formed to be thicker than the lower part of the second gate insulating film 7b (second gate insulating film lower part $7b_2$). For this reason, parts thereof that are the same as in the constitution of the first embodiment are not described in detail herein.

The second gate insulating film 7b is described below.

The second gate insulating film 7b is constituted by the second gate insulating film upper part $7b_1$ and the second gate insulating film lower part $7b_2$.

The second gate insulating film lower part $7b_2$ is formed simultaneously with the first gate insulating film 7a, the second gate insulating film lower part $7b_2$ is formed with the same film thickness as the first gate insulating film 7a.

The second gate insulating film upper part $7b_1$ is made of a silicon oxide film having a film thickness that is greater than that of the first gate insulating film 7a and the second gate insulating film lower part $7b_2$, and that is formed so as to cover the side surface of the second trench upper part $5a_1$. The second gate insulating film lower part $7b_2$ is formed so as to cover the inner wall surface of the second trench lower part $5a_2$.

By this constitution, the conductive layer 5b on the inside of the second trench 5a is adjacent to the second impurity diffusion layer 10b, with an intervening second gate insulating film upper part $7b_1$. If the part of the second impurity diffusion layer 10b that overlaps with the side surface of the second element separation region 5 is the region d, the width of the region d is preferably from 10 nm to 20 nm.

According to the semiconductor device 100 of the second embodiment, the conductive layer 5b on the inside of the second trench 5a is adjacent to the parts of the second impurity diffusion layer 10b and the region d, with an intervening second gate insulating film upper part $7b_1$. For this reason, the junction leakage current in the region d and the GIDL (gate induced drain leakage) can be suppressed to a negligible level.

For this reason, the GIDL occurs only on the side surface of the word line 8, and it is possible to reduce the GIDL to approximately one-half of that in the semiconductor device 100 of the first embodiment. By the width of the region d being in the range from 10 nm to 20 nm, it is possible to prevent an increase in the GIDL occurring at the side wall of the word line 8 and to prevent a decrease in the capacitance of the word line 8. For this reason, it is possible to prevent a decrease in the current driving capacity of the MOS transistor Tr1.

As described above, according to the semiconductor device 100 of the second embodiment, in addition to the effect of first embodiment, it is possible to reduce the junction leakage current. For this reason, it is possible to improve the functioning of the second element separation region 5 as a region for separation of elements. For this reason, it is possible to improve the characteristics of holding an electrical charge that has been written into a cell capacitor.

Next, an example of the method for manufacturing the semiconductor device 100 according to the second embodiment will be described, using FIG. 19 to FIG. 24.

The method for manufacturing the semiconductor device 100 according to the second embodiment is generally constituted by a step of forming a second trench upper part $5a_1$, a step of forming a first trench part 8a and a second trench lower part $5a_2$, and a step of forming a first gate insulating film 7a and a second gate insulating film 7b.

The method for manufacturing the semiconductor device 100 according to the second embodiment differs from the first embodiment only in the step that forms the second gate insulating film upper part $7b_1$ to be thicker than the first gate insulating film 7a and the second gate insulating film lower part $7b_2$. For this reason, parts of the process steps that are the same as noted with regard to the first embodiment are not described in detail herein.

First, as shown in FIG. 12, the process steps up until the step of selective removal of the second sacrificial mask 3 are the same as in the first embodiment.

Figure 20:
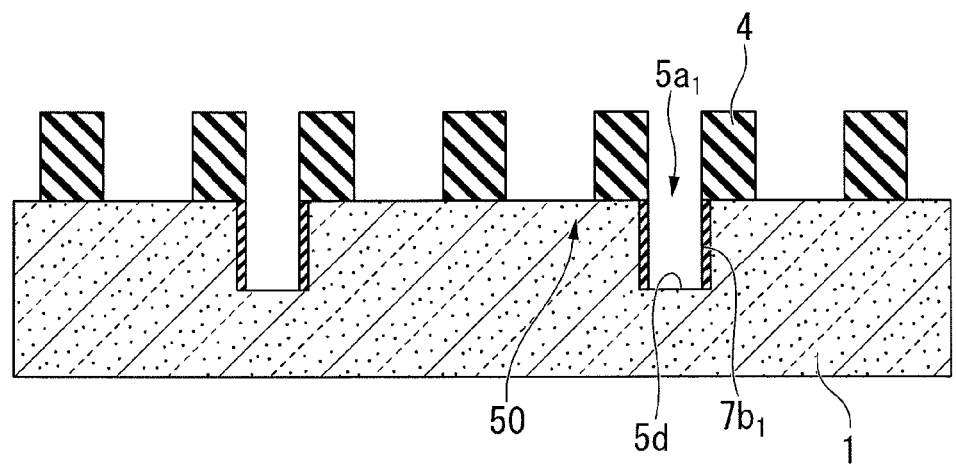
FIG. 20 is a fragmentary cross sectional elevation view of a step involved in a method of forming a semiconductor device in accordance with still another embodiment of the present invention.

Next, as shown in FIG. 20, the second trench upper part $5a_1$ and the second gate insulating film upper part $7b_1$ are formed. First, a third sacrificial mask 4 is formed over the semiconductor substrate 1. Next, the active region 50 and the first element separation region 51 that are exposed in a linear shape are etched to form the second trench upper part $5a_1$ that has a depth of, for example, 100 nm.

Next, using thermal oxidation, a thermal oxide film made of a silicon oxide film having a thickness of, for example, 5 nm is formed on the inner wall surface of the second trench upper part $5a_1$ and the exposed surface of the semiconductor substrate 1. Next, etching is done until the lower surface 5d of the second trench upper part $5a_1$ is exposed, thereby forming a second gate insulating film upper part $7b_1$ that covers the inner wall side surface of the second trench upper part $5a_1$.

Next, the second sacrificial mask 3 is selectively removed, thereby exposing the active region 50 and the first element separation region 51 in a linear shape.

Figure 21:
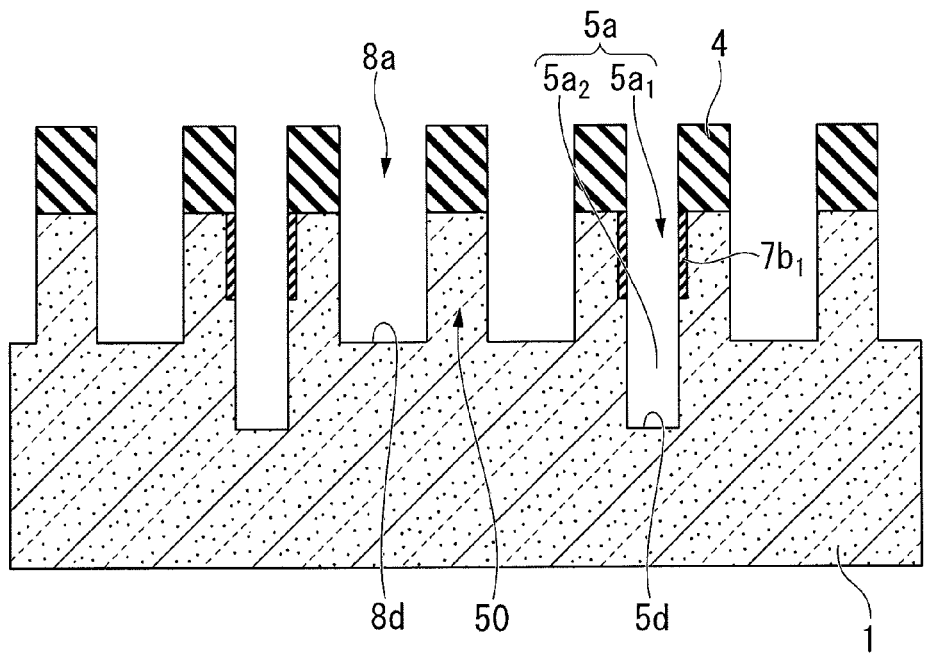
FIG. 21 is a fragmentary cross sectional elevation view of a step, subsequent to the step of FIG. 20, involved in the method of forming the semiconductor device in accordance with still another embodiment of the present invention.

Next, as shown in FIG. 21, the first trench 8a and the second trench lower part $5a_2$ are formed.

First, using dry etching the first trench 8a having a depth of, for example, 150 nm is formed in the region in which the active region 50 and the first element separation region 51 that were exposed. By this etching, the second trench upper part $5a_1$ is additionally etched simultaneously, so that the bottom surface (lower surface 5d) is etched further downward. The trench at the lower part of the second trench upper part $5a_1$ that is etched further downward by the additional etching is taken as the second trench lower part $5a_2$. The second trench lower part $5a_2$ has the same depth as the first trench 8a.

By this etching, a second trench 5a is formed that is constituted by the second trench upper part $5a_1$ and the second trench lower part $5a_2$ and that has a depth of 250 nm. The lower surface 5d of the second trench 5a is formed at a position that is, for example, 100 nm deeper than the lower surface 8d of the first trench 8a. By this etching, of the inner wall surface of the second trench 5a, only the inner wall surface of the second trench upper part $5a_1$ is covered by the second gate insulating film upper part $7b_1$, and the inner wall surface of the second trench lower part $5a_2$ is in the condition in which the semiconductor substrate 1 is exposed.

Figure 22:
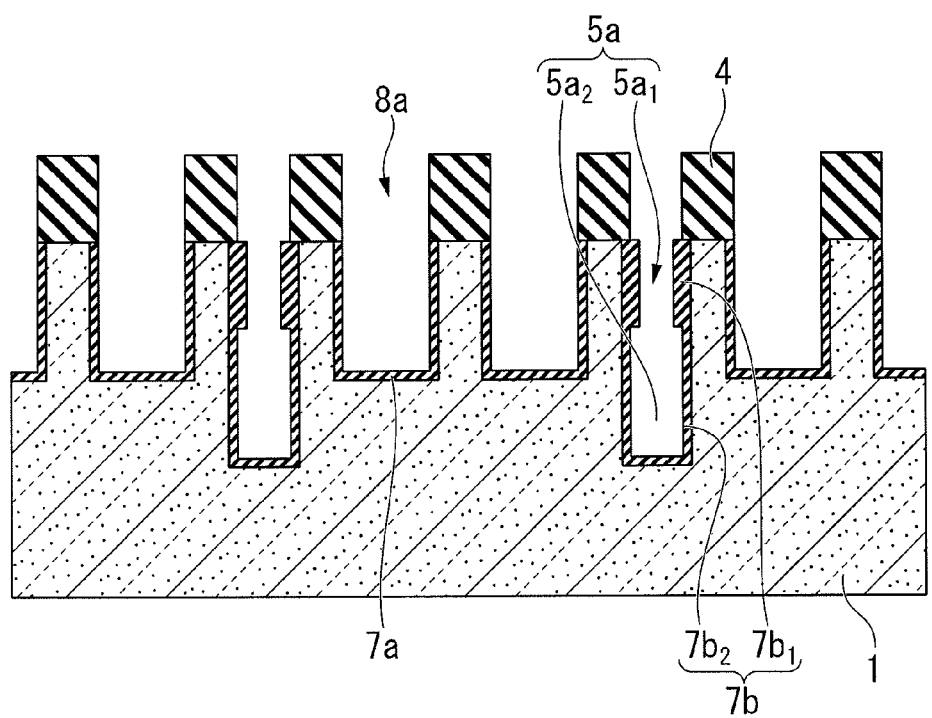
FIG. 22 is a fragmentary cross sectional elevation view of a step, subsequent to the step of FIG. 21, involved in the method of forming the semiconductor device in accordance with still another embodiment of the present invention.

Next, as shown in FIG. 22, thermal oxidation is used to oxidize the inner wall surface of the second trench lower part $5a_2$ and the inner wall surface of the first trench 8a, thereby forming a thermal oxide film (first gate insulating film 7a and second gate insulating film lower part $7b_2$) made of a silicon oxide film and having a film thickness of, for example, 6 nm.

When forming the thermal oxide film, because the second gate insulating film upper part $7b_1$ is simultaneously oxidized, the film thickness of the second gate insulating film upper part $7b_1$ increases to approximately 8 nm, this being a thickness that is greater than that of first gate insulating film 7a and the second gate insulating film $7b_2$. The above forms the second gate insulating film 7b, which is constituted by the second gate insulating film upper part $7b_1$ that covers the side surface of the second trench upper part $5a_1$ and the second gate insulating film lower part $7b_2$ that covers the inner wall surface of the second trench lower part $5a_2$.

Next, a conductive layer is buried into the inside of the first trench 8a and the inside of the second trench 5a, so as to form the word line 8 and the second element separation region 5.

Figure 23:
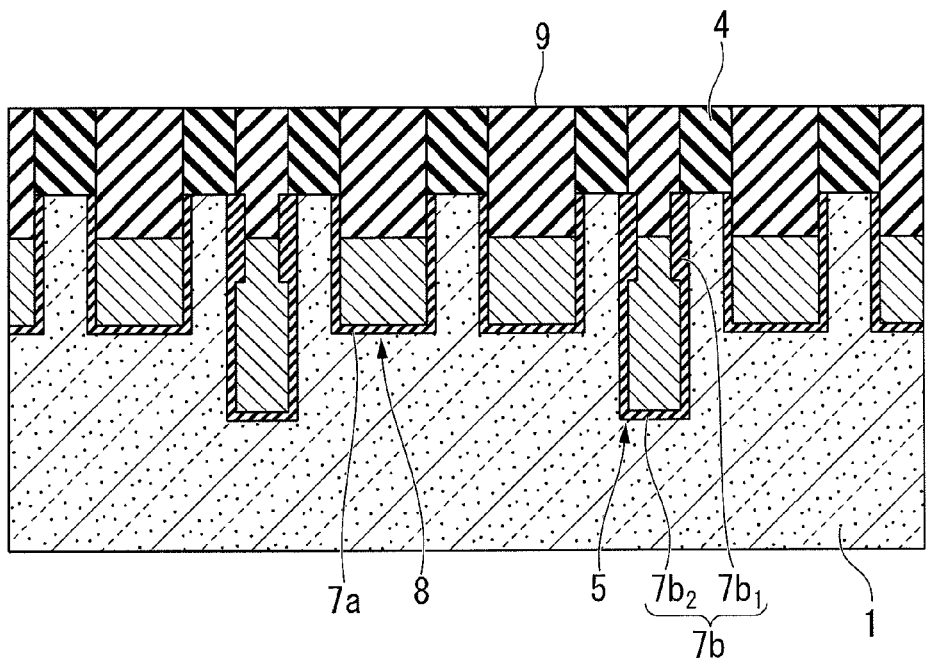
FIG. 23 is a fragmentary cross sectional elevation view of a step, subsequent to the step of FIG. 22, involved in the method of forming the semiconductor device in accordance with still another embodiment of the present invention.

Next, as shown in FIG. 23, the first insulating film 9 is formed.

Figure 24:
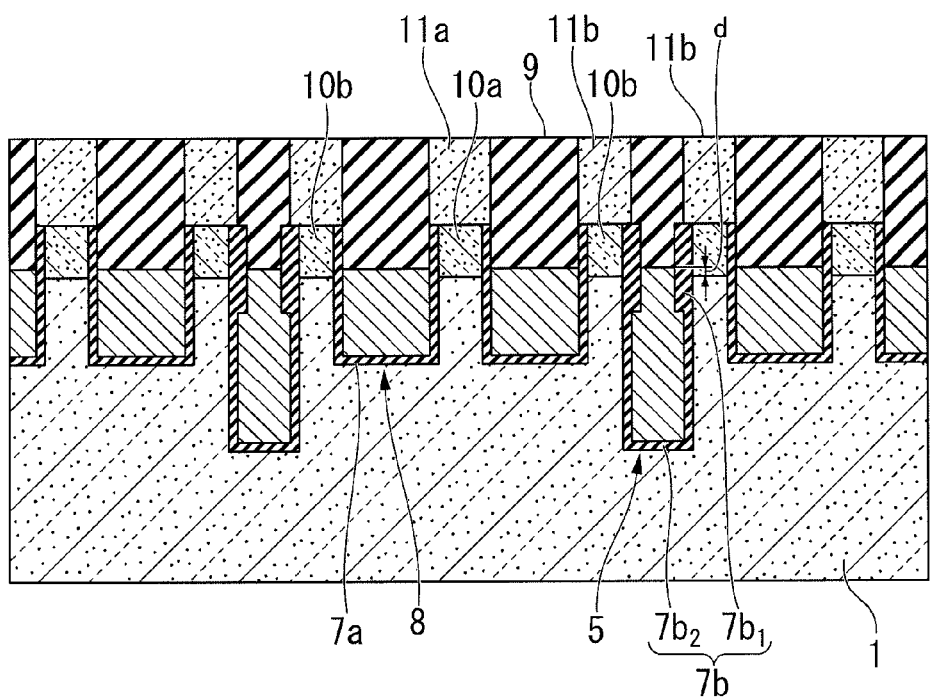
FIG. 24 is a fragmentary cross sectional elevation view of a step, subsequent to the step of FIG. 23, involved in the method of forming the semiconductor device in accordance with still another embodiment of the present invention.

Next, as shown in FIG. 24, the first impurity diffusion layer 10a and the second impurity diffusion layer 10b are formed. By this constitution, the second element separation region 5 is adjacent to the second impurity diffusion layer 10b in the region d, with an intervening second gate insulating film upper part $7b_1$. When this is done, it is preferable that the impurity concentration and the region in which diffusion is done in forming the second impurity diffusion layer 10b are appropriately adjusted so that the width of the region d is in the range from 10 nm to 20 nm.

Next, as shown in FIG. 24, the first contact plug 11a and the second contact plug 11b are formed. After that, as shown in FIG. 19, the bit lines 12, the second insulating film 13, the third contact plugs 14, the capacitors 15, and the interconnects 16 are sequentially formed. The above process steps manufacture the semiconductor device 100, which is the second embodiment.

According to the method for manufacturing the semiconductor device 100 of the second embodiment, after forming the second gate insulating film upper part $7b_1$ on the inner wall side surface of the second trench upper part $5a_1$, thermal oxidation is used to oxidize the inner wall surface of the second trench lower part $5a_2$ and the inner wall surface of the first trench 8a, so as to form the first gate insulating film 7a that covers the inner wall surface of the first trench 8a and the second gate insulating film lower part $7b_2$ that covers the inner wall surface of the second trench lower part $5a_2$, this forming the second gate insulation film upper part $7b_1$ so as to be thicker than the first gate insulating film 7a and the second gate insulating film lower part $7b_2$.

For this reason, the inner surface of the second trench 5a is adjacent to the second impurity diffusion layer 10b in the region d, with the intervening second gate insulation film upper part $7b_1$, and it is possible to suppress junction leakage current in the region d and GIDL to a negligible level. Also, by making the width of the region d within the range from 10 nm to 20 nm, it is possible to suppress an increase in the GIDL occurring at the side surface of the word line 8 and a decrease in the capacitance of the word line 8. For this reason, it is possible to suppress a decrease in the current driving capacity of the MOS transistor Tr1.

The above, in addition to the effect of the first embodiment, enables a reduction in the junction leakage current. For this reason, it is possible to improve the functioning of the second element separation region 5 as a region for separation of elements, and possible to improve the characteristics of holding an electrical charge that has been written into a cell capacitor.

Figure 25:
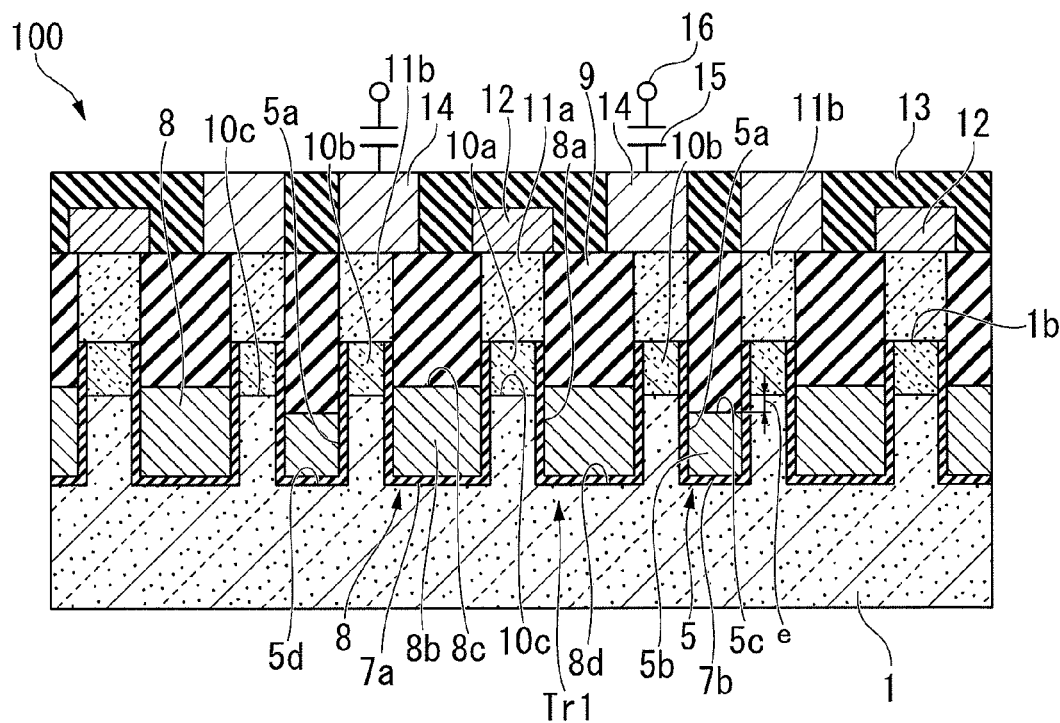
FIG. 25 is a fragmentary cross sectional elevation view of a step, subsequent to the step of FIG. 24, involved in the method of forming the semiconductor device in accordance with still another embodiment of the present invention.

Next, a semiconductor device 100 according to a third embodiment will be described, using FIG. 25. FIG. 25 is a cross-sectional view for describing the semiconductor device 100 according to the third embodiment, this showing a cross-sectional view along the line A-A' of FIG. 1. The semiconductor device 100 of the third embodiment differs from the semiconductor device 100 of the first embodiment only with regard to the constitution of the second element separation region 5. For this reason, parts that are the same as in the constitution of first embodiment will not be described in detail herein.

The second element separation region 5 and parts relating to the second element separation region 5 are described below.

The second element separation region 5 is formed by burying a conductive layer 5b in the second trench 5a, with an intervening second gate insulating film 7b. The upper surface 5c of the conductive layer 5b that forms the second element separation region 5 is positioned at a position that is deeper than the lower surface 10c of the impurity diffusion layers (first impurity diffusion layer 10a and second impurity diffusion layer 10b).

If the difference in height between the upper surface 5c and the lower surface 10c is distance e, it is preferable that the distance e be at least 20 nm. Also, it is preferable that the depth from the upper surface 1b of the semiconductor substrate 1 to the upper surface 5c of the conductive layer 5b buried in the second trench 5a be no greater than 0.8 times the depth from the upper surface 1b of the semiconductor substrate 1 to the bottom part (lower surface 5d) of the second trench 5a.

The upper surface 8c of the conductive layer 8b is positioned at a position that is shallower than the upper surface 5c of the conductive layer 5b and the lower surface 10c of the impurity diffusion layers.

Although in FIG. 25 the second trench 5a is formed at the same depth as the first trench 8a, it is particularly preferable that it be formed to be deeper than the first trench 8a.

The first insulating film 9 is formed so that it covers the upper surface 8c and the upper surface 5c and also so that it buries the inside of the first trench 8a and the inside of the second trench 5a.

In the semiconductor device 100 of the third embodiment, the upper surface 5c of the conductive layer 5b is formed to be positioned at a position that is deeper than the lower surface 10c of the impurity diffusion layers (first impurity diffusion layer 10a and second impurity diffusion layer 10b). For this reason, there is no overlap of the side surface of the conductive layer 5b and the impurity diffusion layers with an intervening second gate insulating film 7b. For this reason, it is possible to suppress an increase in the electric field strength between the side surface of the first impurity diffusion layer 10a and the side surface of the second element separation region 5.

By the difference in height between the upper surface 5c of the conductive layer 5b and the lower surface 10c of the impurity diffusion layers (distance e) being at least 20 nm, there is sufficient separation between the side surface of the conductive layer 5b and the impurity diffusion layers. For this reason, it is possible to more effectively suppress an increase in the electric field strength between the side wall of the first impurity diffusion layer 10a and the side surface of the second element separation region 5, making it possible to improve the functioning of the second element separation region 5 as a region for separation of elements.

By the depth from the upper surface 1b of the semiconductor substrate 1 to the upper surface 5c of the conductive layer 5b being no greater than 0.8 times the depth from the upper surface 1b of the semiconductor substrate 1 to the lower surface 5d of the second trench 5a, a sufficient difference in height is achieved between the upper surface 5c of the conductive layer 5b and the lower surface 10c of the impurity diffusion layers.

By the above, the semiconductor device 100 of the third embodiment, in addition to the effect of the semiconductor device 100 of the first embodiment, enables the suppression of junction leakage current in the MOS transistor Tr1. For this reason, it is possible to sufficient hold an electrical charge that has been written into a cell capacitor.

Because the upper surface 8c of the conductive layer 8b is positioned at a position that is shallower than the lower surface 10c of the impurity diffusion layers, the conductive layer 8b (word line 8) is formed with a sufficient thickness. For this reason, it is possible to prevent a decrease in the current driving capacity of the MOS transistor Tr1.

Next, an example of a method for manufacturing the semiconductor device 100 according to the third embodiment will be described, using FIG. 25 to FIG. 34.

The method for manufacturing the semiconductor device 100 according to the third embodiment is generally constituted to the semiconductor substrate 1 by a step of forming a first trench 8a and a second trench 5a and a step of etching back the upper surface 5c of the conductive layer 5b buried in the second trench 5a. In the following, parts that are the same as process steps noted with regard to the first embodiment will not be described in detail.

First, as shown in FIG. 8, the process steps up until the formation of the pattern of the second sacrificial mask 3 are performed in the same manner as in the first embodiment.

Figure 26:
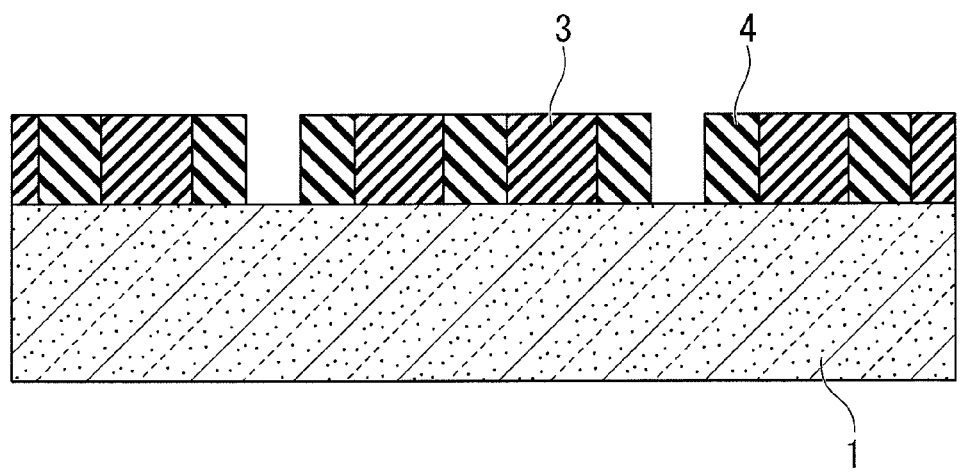
FIG. 26 is a fragmentary cross sectional elevation view of a step involved in a method of forming a semiconductor device in accordance with yet another embodiment of the present invention.
Figure 27:
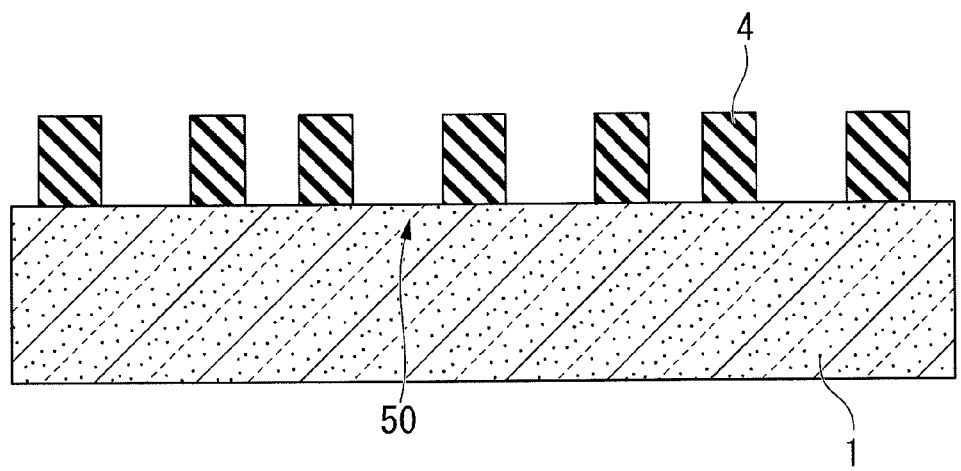
FIG. 27 is a fragmentary cross sectional elevation view of a step, subsequent to the step of FIG. 26, involved in the method of forming the semiconductor device in accordance with yet another embodiment of the present invention.

Next, as shown in FIG. 26, the third sacrificial mask 4 is formed over the semiconductor substrate 1. Next, as shown in FIG. 27, the second sacrificial mask 3 is selectively removed, so as to expose the active region 50 and the first element separation region 51 in a linear shape.

Figure 28:
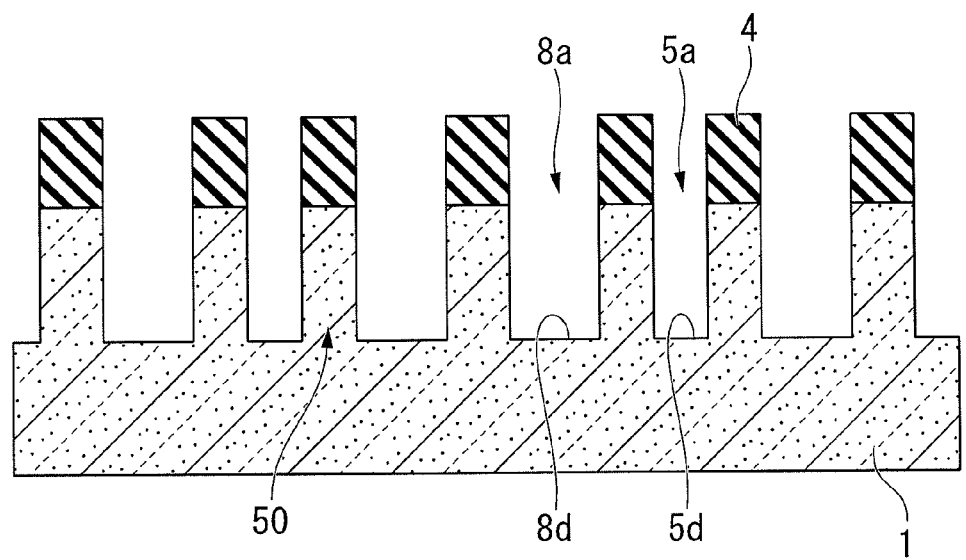
FIG. 28 is a fragmentary cross sectional elevation view of a step, subsequent to the step of FIG. 27, involved in the method of forming the semiconductor device in accordance with yet another embodiment of the present invention.

Next, as shown in FIG. 28, the exposed active region 50 and the first element separation region 51 are etched, and the first trench 8a and the second trench 5a are simultaneously formed with the same depth. When this is done, the lower surface 5d of the second trench 5a and the lower surface 8d of the first trench 8a are made to have the same height.

Figure 29:
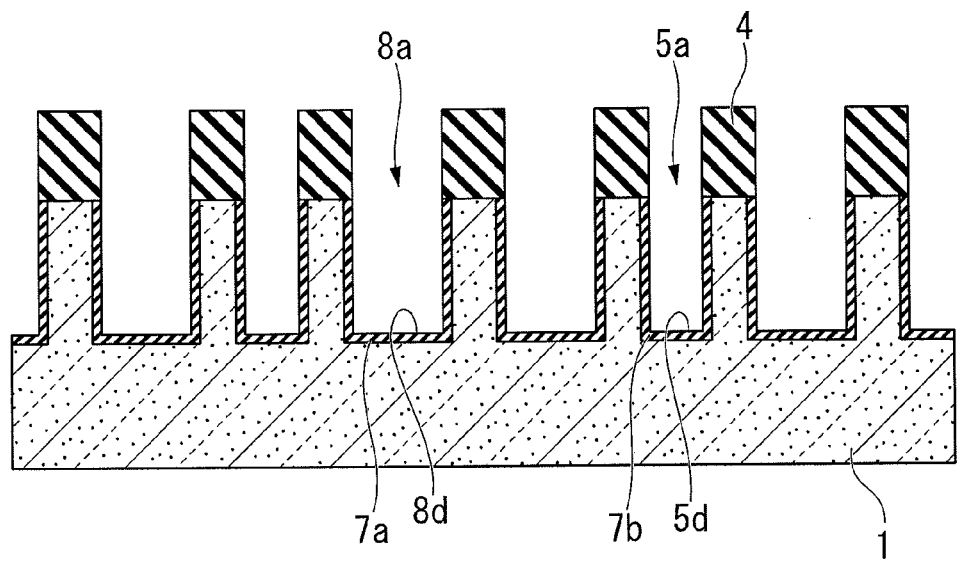
FIG. 29 is a fragmentary cross sectional elevation view of a step, subsequent to the step of FIG. 28, involved in the method of forming the semiconductor device in accordance with yet another embodiment of the present invention.

Next, as shown in FIG. 29, the inner wall surface of the first trench 8a and the inner wall surface of the second trench 5a are oxidized, thereby forming the first gate insulating film 7a and the second gate insulating film 7b.

Figure 30:
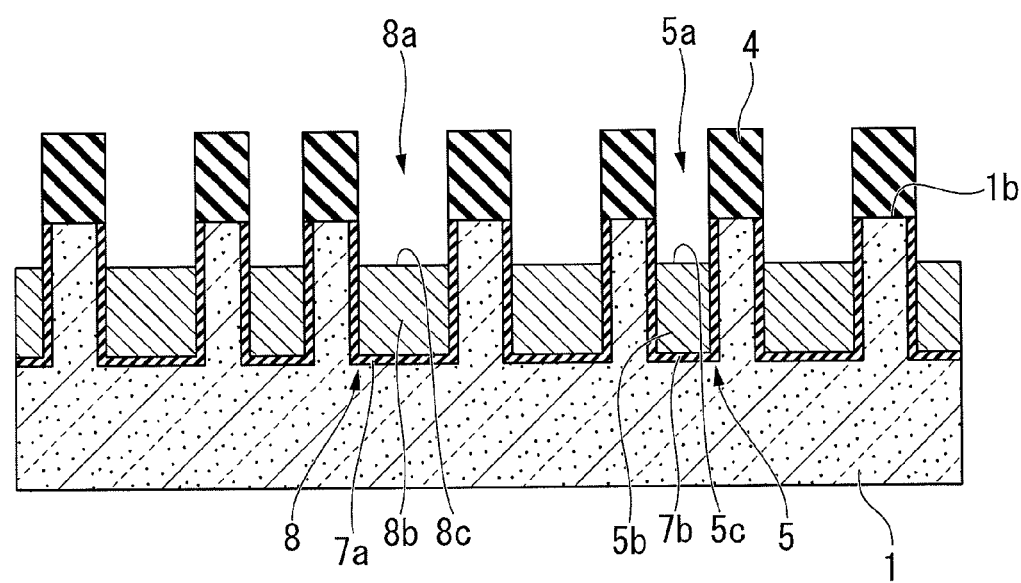
FIG. 30 is a fragmentary cross sectional elevation view of a step, subsequent to the step of FIG. 29, involved in the method of forming the semiconductor device in accordance with yet another embodiment of the present invention.

Next, as shown in FIG. 30, a conductive layer is formed by burying into the first trench 8a and the second trench 5a. When this is done, the etching conditions are adjusted so that the upper surface 8c of the conductive layer 8b inside the first trench 8a and the upper surface 5c of the conductive layer 5b inside the second trench 5a are positioned at a position that is, for example, approximately 50 nm deeper from the upper surface 1b of the semiconductor substrate 1.

Figure 31:
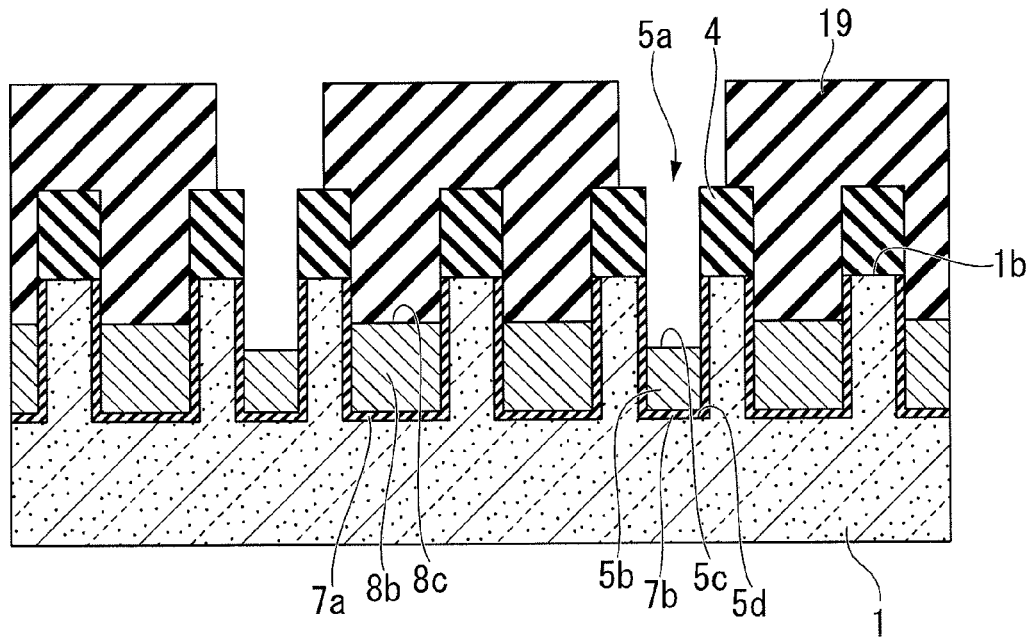
FIG. 31 is a fragmentary cross sectional elevation view of a step, subsequent to the step of FIG. 30, involved in the method of forming the semiconductor device in accordance with yet another embodiment of the present invention.

Next, as shown in FIG. 31, the upper surface 5c of the conductive layer 5b is etched back. First, a fourth sacrificial mask 19 made of, for example, a silicon nitride film is formed so as to cover the upper surface 5c of the conductive layer 5b, the upper surface 8c of the conductive layer 8b, and the third sacrificial mask 4. Next, the fourth sacrificial mask 19 is etched back, so as to expose the upper surface 5c of the conductive layer 5b. Next, etching is done using the fourth sacrificial mask 19 as a mask, so as to etch the upper surface 5c of the conductive layer 5b downward by, for example, 50 nm. By this etching, the upper surface 5c of the conductive layer 5b is formed at a position that is deeper than the upper surface 8c of the conductive layer 8b.

When this is done, it is preferable that the etching conditions are adjusted so that the depth from the upper surface 1b of the semiconductor substrate 1 to the upper surface 5c of the conductive layer 5b is no greater than 0.8 times the depth from the upper surface 1b of the semiconductor substrate 1 to the lower surface 5d of the second trench 5a.

Figure 32:
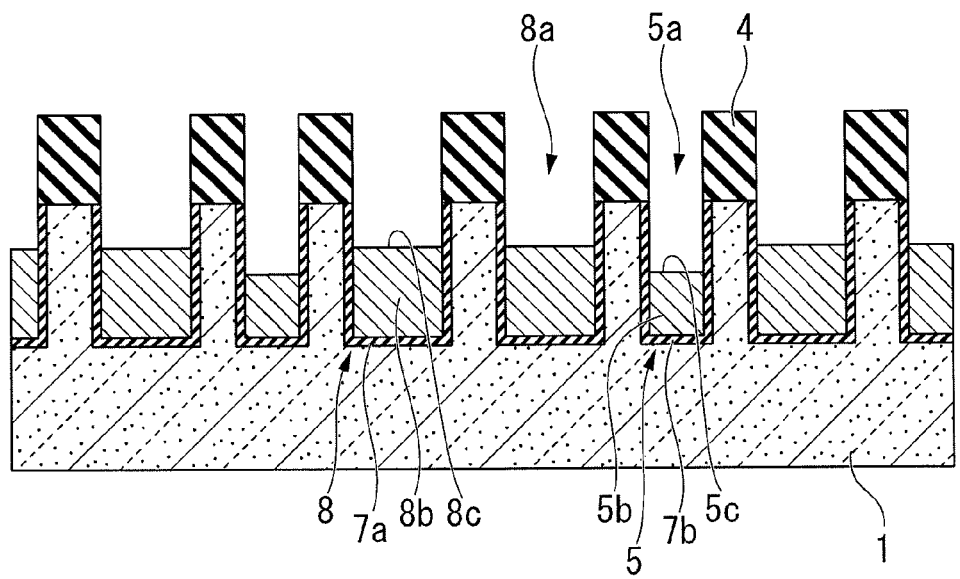
FIG. 32 is a fragmentary cross sectional elevation view of a step, subsequent to the step of FIG. 31, involved in the method of forming the semiconductor device in accordance with yet another embodiment of the present invention.

Next, as shown in FIG. 32, the fourth sacrificial mask 19 is removed, so as to expose the upper surface 5c of the conductive layer 5b and the upper surface 8c of the conductive layer 8b.

Figure 33:
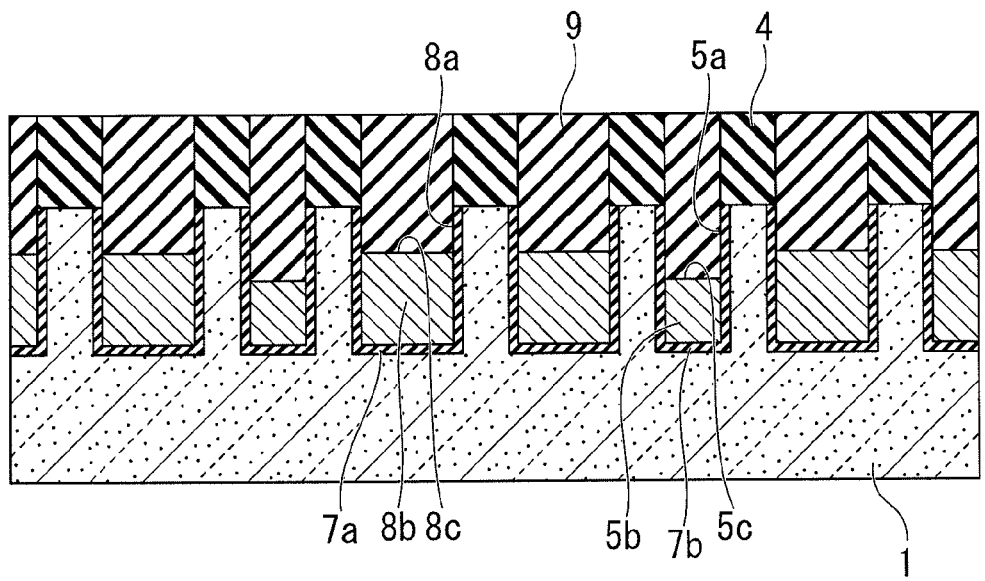
FIG. 33 is a fragmentary cross sectional elevation view of a step, subsequent to the step of FIG. 32, involved in the method of forming the semiconductor device in accordance with yet another embodiment of the present invention.

Next, as shown in FIG. 33, the first insulating film 9 is formed so as to bury the first trench 8a and the second trench 5a. Then, CMP is done to polish the surface of the first insulating film 9 until the third sacrificial mask 4 is exposed.

Figure 34:
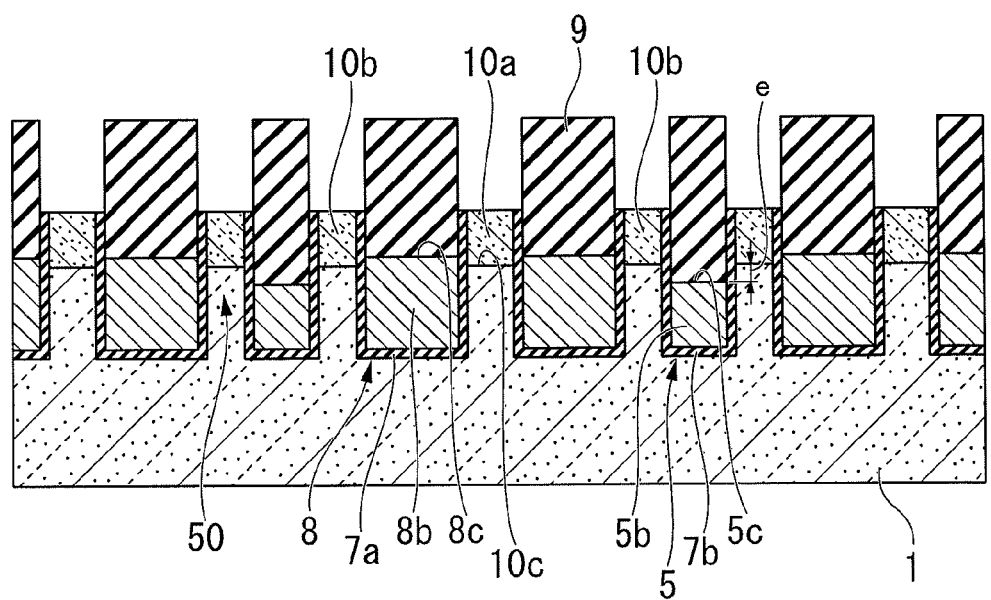
FIG. 34 is a fragmentary cross sectional elevation view of a step, subsequent to the step of FIG. 33, involved in the method of forming the semiconductor device in accordance with yet another embodiment of the present invention.

Next, as shown in FIG. 34, the third sacrificial mask 4 is removed, so as to expose the surface of the active region 50. Next, the first impurity diffusion layer 10a and the second impurity diffusion layer 10b are formed.

When this is done, the impurity concentrations and diffusion conditions are adjusted so that the lower surface 10c of the impurity diffusion layers (first impurity diffusion layer 10a and second impurity diffusion layer 10b) is shallower than the upper surface 5c of the conductive layer 5b and also deeper than the upper surface 8c of the conductive layer 8b.

By making adjustment so that the position of the lower surface 10c of the impurity diffusion layers is at a position that is shallower than the upper surface 5c of the conductive layer 5b, there is a distance of just e separating the upper surface 5c of the conductive layer 5b and the lower surface 10c of the impurity diffusion layers. In this case, it is preferable that the distance e be at least 20 nm.

After the above, as shown in FIG. 25, the first contact plugs 11a and the second contact plugs 11b are formed. After that, the bit lines 12, the second insulating film 13, the third contact plugs 14, the capacitors 15, and the interconnects 16 are sequentially formed, thereby forming the semiconductor device 100 of the third embodiment.

According to the method for manufacturing the semiconductor device 100 of the third embodiment, by etching back so as to form the upper surface 5c of the conductive layer 5b so that it is at a position that is deeper than the upper surface 8c of the conductive layer 8b and the lower surface 10c of the impurity diffusion layers, it is possible to distance the upper surface 5c of the conductive layer 5b from the lower surface 10c of the impurity diffusion layers.

Also, by making the depth from the upper surface 1b of the semiconductor substrate 1 to the upper surface 5c of the conductive layer 5b no greater than 0.8 times the depth from the upper surface 1b of the semiconductor substrate 1 to the lower surface 5d of the second trench 5a, it is possible to obtain a sufficient difference in height between the upper surface 5c of the conductive layer 5b and the lower surface 10c of the impurity diffusion layers. By controlling the film thickness of the conductive layer 5b, it is possible to easily adjust the difference in height between the upper surface 5c of the conductive layer 5b and the lower surface 10c of the impurity diffusion layers.

By adjusting the etching back conditions or the impurity diffusion layer formation conditions so that the difference in height (distance e) between the upper surface 5c of the conductive layer 5b and the lower surface 10c of the impurity diffusion layers is at least 20 nm, it is possible to achieve a sufficient distance between the side surface of the conductive layer 5b and the impurity diffusion layers (first impurity diffusion layer 10a and second impurity diffusion layer 10b). For this reason, it is possible to more effectively suppress an increase in the electric field strength between the side surface of the first impurity diffusion layer 10a and the side surface of the second element separation region 5. It is therefore possible to improve the functioning of the second element separation region 5 as a region for separation of elements.

Figure 40:
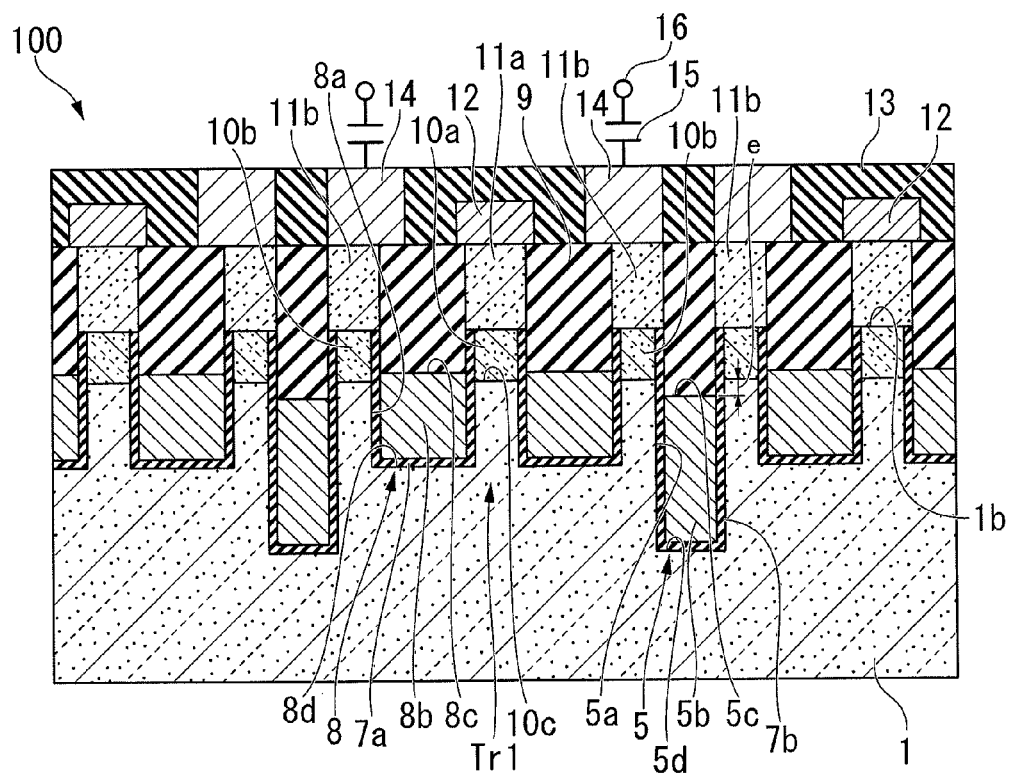
FIG. 40 is a fragmentary cross sectional elevation view of a step, subsequent to the step of FIG. 39, involved in the method of forming the semiconductor device in accordance with yet another embodiment of the present invention.

Next, a semiconductor device 100 according to a fourth embodiment will be described, using FIG. 40. FIG. 40 is a cross-sectional view for describing the semiconductor device 100 of the fourth embodiment, this showing a cross-sectional view along the line A-A' of FIG. 1. The semiconductor device 100 of the fourth embodiment differs from the semiconductor device 100 of the first embodiment only with regard to the position of the upper surface 5c of the conductive layer 5b that forms the second element separation region 5. For this reason, parts that have the same constitution as in the first embodiment are not described in detail herein.

The second element separation region 5 and parts relating to the second element separation region 5 are described below.

The second trench 5a is formed more deeply than the first trench 8a. The upper surface 5c of the conductive layer 5b that forms the second element separation region 5 is positioned at a position that is deeper than the lower surface 10c of the impurity diffusion layers (first impurity diffusion layer 10a and second impurity diffusion layer 10b).

If the difference in height between the upper surface 5c of the conductive layer 5b and the lower surface 10c is distance e, it is preferable that the distance e be at least 20 nm. Also, it is preferable that the depth from the upper surface 1b of the semiconductor substrate 1 to the upper surface 5c of the conductive layer 5b buried in the second trench 5a be no greater than 0.8 times the depth from the upper surface 1b of the semiconductor substrate 1 to the bottom part (lower surface 5d) of the second trench 5a. The upper surface 8c of the conductive layer 8b is positioned at a position that is shallower than the upper surface 5c of the conductive layer 5b and the lower surface 10c.

The first insulating film 9 is formed so that it covers the upper surface 8c of the conductive layer 8b and the upper surface 5c of the conductive layer 5b, and also so that it buries the inside of the first trench 8a and the inside of the second trench 5a.

In the semiconductor device 100 of the fourth embodiment, because the upper surface 5c of the conductive layer 5b is positioned at a position that is deeper than the lower surface 10c, it is possible to suppress an increase in the electric field strength between the side surface of the first impurity diffusion layer 10a and the side surface of the second element separation region 5.

By the difference in height between upper surface 5c of the conductive layer 5b and the lower surface 10c (distance e) being at least 20 nm, it is possible to suppress an increase in the electric field strength between the side surface of the first impurity diffusion layer 10a and the side surface of the second element separation region 5. Also, by the depth from the upper surface 1b to the upper surface 5c of the conductive layer 5b being formed to be no greater than 0.8 times the depth from the upper surface 1b to the lower surface 5d, a sufficient difference in height is achieved between the upper surface 5c of the conductive layer 5b and the lower surface 10c.

Because the lower surface 5d of the second element separation region 5 is formed to be positioned at a position that is deeper than the lower surface 8d of the word line 8, it is possible to suppress a decrease in the element separation ability of the second element separation region 5. For this reason, it is possible prevent information interference between adjacent MOS transistors Tr1 and to suppress the junction leakage current. It is also possible to prevent a worsening of the information holding characteristics due to the shrinking of sizes in the semiconductor device 100.

By the above, the semiconductor device 100 of the fourth embodiment, in addition to the effect of the semiconductor device 100 of the first embodiment, can suppress the junction leakage current in the MOS transistor Tr1. For this reason, it is possible to sufficiently hold an electrical charge that has been written into a cell capacitor.

Next, an example of the method for manufacturing the semiconductor device 100 according to the fourth embodiment will be described, using FIG. 35 to FIG. 40.

The method for manufacturing the semiconductor device 100 according to the fourth embodiment is generally constituted by a step of forming, on the semiconductor substrate 1, a first trench 8a and a second trench 5a, and a step of etching back the upper surface 5c of the conductive layer 5b buried in the second trench 5a. In the following, the parts that are the same process steps as noted with regard to the first embodiment are not described in detail.

Figure 35:
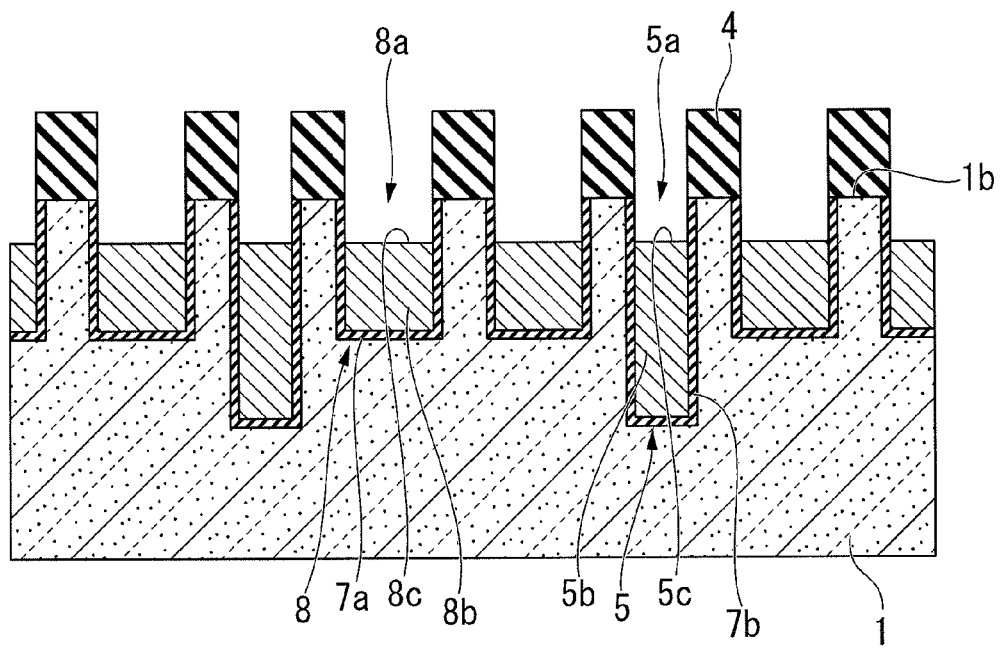
FIG. 35 is a fragmentary cross sectional elevation view of a step, subsequent to the step of FIG. 34, involved in the method of forming the semiconductor device in accordance with yet another embodiment of the present invention.

First, as shown in FIG. 15, the steps up until burying a conductive layer into the first trench 8a and into the second trench 5a are performed in the same manner as in the first embodiment. FIG. 35 shows the condition in which the conductive layer 5b and the conductive layer 8b have been formed.

Figure 36:
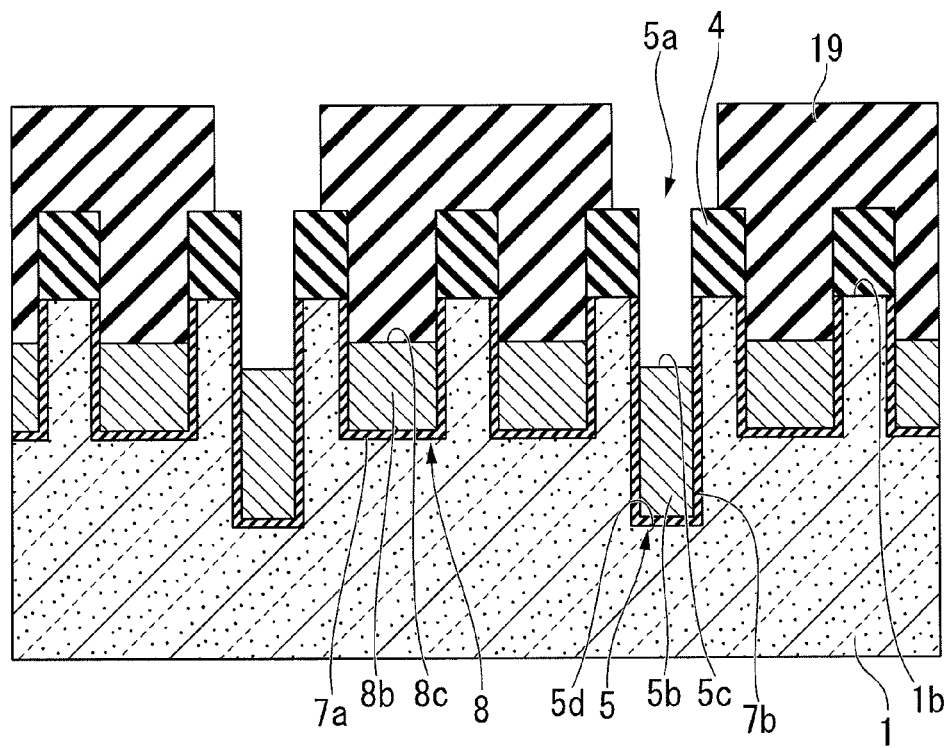
FIG. 36 is a fragmentary cross sectional elevation view of a step, subsequent to the step of FIG. 35, involved in the method of forming the semiconductor device in accordance with yet another embodiment of the present invention.

Next, as shown in FIG. 36, a fourth sacrificial mask 19 is formed over the semiconductor substrate 1. Then, the fourth sacrificial mask 19 over the second trench 5a is selectively removed, thereby exposing the third sacrificial mask 4 and the upper surface 5c of the conductive layer 5b.

Next, by etching using the fourth sacrificial mask 19 and the third sacrificial mask 4 as masks, the upper surface 5c of the conductive layer 5b is etched down, for example, 50 nm.

By this etching, the upper surface 5c of the conductive layer 5b is positioned at a position that is deeper than the upper surface 8c of the conductive layer 8b.

When this is done, it is preferable that the etching conditions be adjusted so that the depth from the upper surface 1b of the semiconductor substrate 1 to the upper surface 5c of the conductive layer 5b is no greater than 0.8 times the depth from the upper surface 1b of the semiconductor substrate 1 to the bottom part (lower surface 5d) of the second trench 5a.

Figure 37:
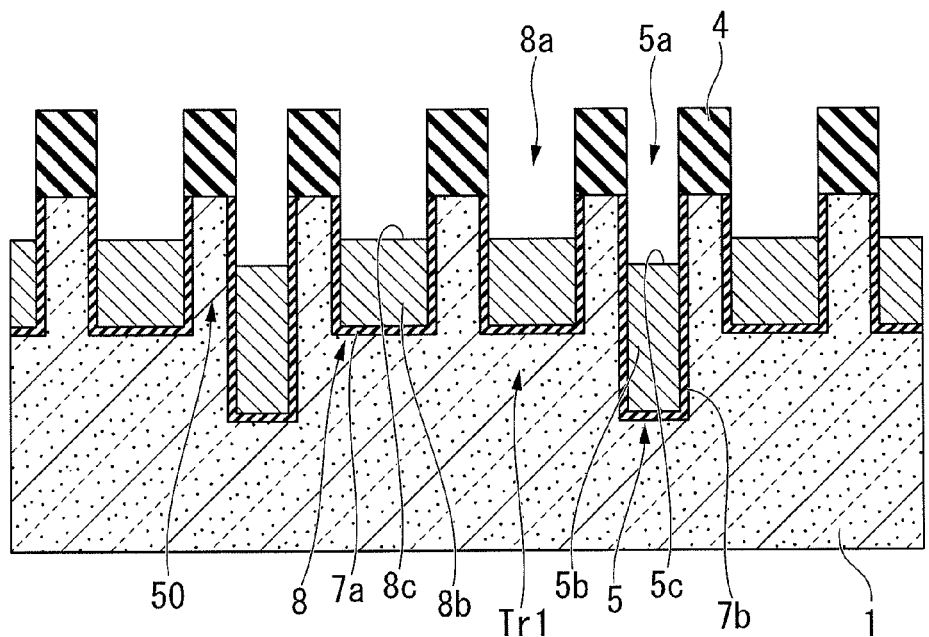
FIG. 37 is a fragmentary cross sectional elevation view of a step, subsequent to the step of FIG. 36, involved in the method of forming the semiconductor device in accordance with yet another embodiment of the present invention.

Next, as shown in FIG. 37, the fourth sacrificial mask 19 is removed, thereby exposing the upper surface 5c of the conductive layer 5b and the upper surface 8c of the conductive layer 8b.

Figure 38:
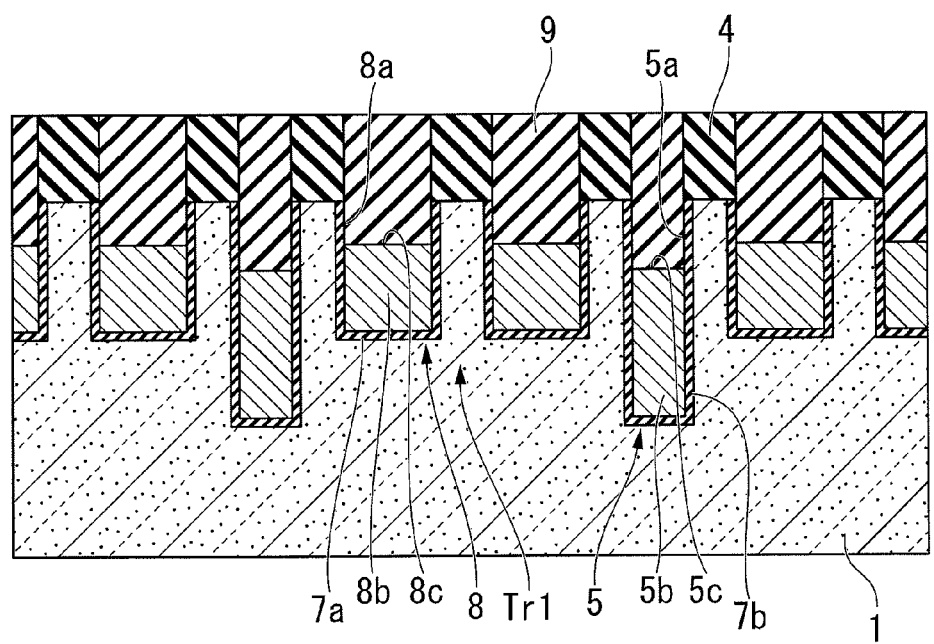
FIG. 38 is a fragmentary cross sectional elevation view of a step, subsequent to the step of FIG. 37, involved in the method of forming the semiconductor device in accordance with yet another embodiment of the present invention.

Next, as shown in FIG. 38, the first insulating film 9 is formed so as to bury the first trench 8a and the second trench 5a. Then, CMP is used to polish the surface of the first insulating film 9 until the third sacrificial mask 4 is exposed.

Figure 39:
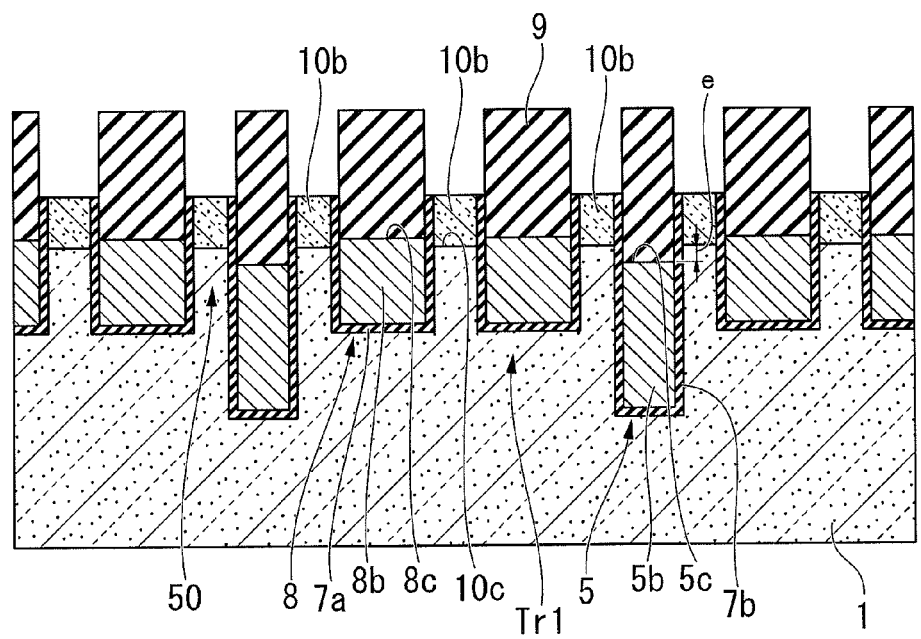
FIG. 39 is a fragmentary cross sectional elevation view of a step, subsequent to the step of FIG. 38, involved in the method of forming the semiconductor device in accordance with yet another embodiment of the present invention.

Next, as shown in FIG. 39, the third sacrificial mask 4 is removed, thereby exposing the surface of the active region 50. Then, the first impurity diffusion layer 10a and the second impurity diffusion layer 10b are formed. When this is done, the impurity concentration and diffusion conditions are adjusted so that lower surface 10c of the impurity diffusion layers (first impurity diffusion layer 10a and second impurity diffusion layer 10b) is positioned at a position that is shallower than the upper surface 5c of the conductive layer 5b and also deeper than the upper surface 8c of the conductive layer 8b.

In this manner, by the impurity diffusion layer lower surface 10c being adjusted to a position that is shallower than the upper surface 5c of the conductive layer 5b, the upper surface 5c of the conductive layer 5b is distanced from the lower surface 10c of the impurity diffusion layers by just the distance e. When this is done, it is preferable that the distance e be at least 20 nm.

Next, as shown in FIG. 40, the first contact plugs 11a and the second contact plugs 11b are formed. After that, the bit lines 12, the second insulating film 13, the third contact plugs 14, the capacitors 15, and the interconnects 16 are sequentially formed, thereby forming the semiconductor device 100 of the fourth embodiment.

According to the method for manufacturing the semiconductor device 100 in to the fourth embodiment, by forming the lower surface 5d of the second element separation region 5 at a position that is deeper than the lower surface 8d of the word line 8, it is possible to suppress a reduction of the element separation ability of the second element separation region 5. For this reason, it is possible to prevent information interference between adjacent MOS transistors Tr1, and possible to suppress the junction leakage current. It is also possible to prevent a worsening of the information holding characteristics due to the shrinking sizes in the semiconductor device 100.

By forming the upper surface 5c of the conductive layer 5b so that it is positioned at a position that is deeper than the lower surface 10c of the impurity diffusion layers, it is possible to suppress an increase in the electric field strength between the side surface of the first impurity diffusion layer 10a and the side surface of the second element separation region 5.

By making the difference in height (distance e) between the upper surface 5c of the conductive layer 5b and the lower surface 10c of the impurity diffusion layers at least 20 nm, it is possible to suppress an increase in the electric field strength between the side surface of the first impurity diffusion layer 10a and the side surface of the element separation region 5. Also, by making the depth from the upper surface 1b to the upper surface 5c of the conductive layer 5b no greater than 0.8 times the depth from the upper surface 1b to the lower surface 5d, it is possible to achieve a sufficient difference in height between the upper surface 5c of the conductive layer 5b and the lower surface 10c of the impurity diffusion layers. It is possible to easily adjust the difference in height between the upper surface 5c of the conductive layer 5b and the lower surface 10c of the impurity diffusion layers by controlling the film thickness of the conductive layer 5b.

EXAMPLES

The present invention will be specifically described hereinafter based on the examples. The present invention, however, is not restricted to these examples.

Example 1

As the example 1, the method for manufacturing the semiconductor device 100 of the first embodiment will be described.

The semiconductor substrate 1 made of a silicon contained a p-type impurity with a concentration of $1.0\times10^{17}/cm^3$ is prepared. Next, the first element separation region 51 and the active region 50 having a width of 75 nm in the X direction the active region 50 formed on the upper surface of the p-type semiconductor substrate 1. The first element separation region 51 is formed with the depth of 300 nm.

Next, as shown in FIG. 3 and FIG. 4, the first sacrificial mask 2 is formed. First, a silicon nitride film having a film thickness of 150 nm is formed so as to cover over the semiconductor substrate 1. Next, using the lithography and dry etching technologies, a linearly shaped first sacrificial mask 2 is formed, arranged with a spacing of 450 nm and having a width of 175 nm.

Next, as shown in FIG. 5 and FIG. 6, a second sacrificial mask 3 is formed. First, CVD is used to form a silicon oxide film so as to have a film thickness of 100 nm and so as to cover the semiconductor substrate 1. Next, the silicon oxide film is etched into a sidewall shape, thereby forming the second sacrificial mask 3. Next, as shown in FIG. 7 and FIG. 8, only the first sacrificial mask 2 is selectively removed.

Next, using CVD, a silicon nitride film having a film thickness of 60 nm is formed so as to cover the semiconductor substrate 1. Next, the silicon nitride film is etched into a sidewall shape, thereby forming the third sacrificial mask 4.

Next, as shown in FIG. 9 and FIG. 10, the active region 50 and the first element separation region 51 exposing in a line shape are etched so as to form the second trench upper part $5a_1$ having a width of 55 nm and a depth of 100 nm in the X direction.

Next, as shown in FIG. 11 and FIG. 12, the second sacrificial mask 3 is selectively removed so as to expose the active region 50 and the first element separation region 51 in a linear shape.

Next, as shown in FIG. 13, the first trench 8a having a width in the X direction of 100 nm and a depth of 150 nm is formed in a region in which the active region 50 and the first element separation region 51 have been exposed. When this is done, the bottom surface (lower surface) 5d of the second trench upper surface $5a_1$ is etched further downward. The second trench lower part $5a_2$ having a depth of 150 nm is formed by this additional etching. By the above, a second trench 5a constituted by a second trench upper part $5a_1$ and a second trench lower part $5a_2$ and having a depth of 250 nm is formed. By doing this, the width of the first element separation region 51 of the lower surface side of the second trench 5a is 50 nm, and the thickness of the first element separation region 51 of the lower surface side of the first trench 8a is 150 nm. Although the plurality of the first trenches 8a exhibits varying depths respectively, they are formed shallower than all second trenches 5a. The difference of the depths between the first trench 8a and the second trench 5a is the range between 20 nm to 100 nm.

Next, as shown in FIG. 14, thermal oxidation is used to oxidize the inner wall of the second trench 5a and the inner wall of the first trench 8a, so as to form the first gate insulating film 7a that covers the inner wall of the first trench 8a and the second gate insulating film 7b that covers the inner wall of the second trench 5a made from a silicon oxide film having a film thickness of 6 nm.

Next, as shown in FIG. 15, a word line 8 and a second element separation region 5 are formed. First, a titanium nitride film having a film thickness of 5 nm and a tungsten film having a film thickness of 60 nm are sequentially deposited inside the second trench 5a and inside the first trench 8a. Next, the upper surface 5c of the conductive layer 5b and the upper surface 8c of the conductive layer 8b are etched back until reaching approximately 50 nm on the lower surface side from the upper surface 1b of the semiconductor substrate 1.

Next, as shown in FIG. 16, a first insulating film 9 made of silicon nitride with a film thickness of 60 nm is formed, and then CMP is performed to polish the surface of the first insulating film 9 until the third sacrificial mask 4 is exposed.

Next, as shown in FIG. 17, a first impurity diffusion layer 10a and a second impurity diffusion layer 10b are formed. First, only the third sacrificial mask 4 is selectively removed, so as to expose the active region 50. Next, phosphorus is implanted into the surface of the active region 50 so as to have a concentration of $2.0\times10^{13}/cm^3$ using an acceleration energy of 25 keV. Then, heat treatment is done for 10 s at 950° C. so as to cause diffusion of the phosphorus.

Next, by a selective epitaxial growth technique, an epitaxy layer is grown over the first impurity diffusion layer 10a and over the second impurity diffusion layer 10b. Next, an impurity such as arsenic is introduced into the epitaxy layer, and as shown in FIG. 18, the first contact plug 11a and the second contact plug 11b are formed.

After that, as shown in FIG. 2, the bit lines 12, the second insulating film 13, the third contact plugs 14, the capacitors 15, and the interconnects 16 are sequentially formed, thereby manufacturing the semiconductor device 100.

Example 2

As the example 2, the method for manufacturing the semiconductor device 100 of the second embodiment will be described. Parts of the process steps that are the same as noted with regard to the first example will not be described in detail herein.

First, as shown in FIG. 12, the process steps up until the selective removal of the second sacrificial mask 3 are performed in the manner as in the first embodiment.

Next, as shown in FIG. 20, the second trench upper part $5a_1$ and the second gate insulating film upper part $7b_1$ are formed. First, using the third sacrificial mask 4 as a mask, the active region 50 and the first element separation region 51 are etched so as to form the second trench upper part $5a_1$ having a width of 55 nm in the X direction and a depth of 100 nm.

Next, using thermal oxidation, a silicon oxide film having a film thickness of 5 nm is formed on the inner wall surface of the second trench upper part $5a_1$ and the exposed surface of the semiconductor substrate 1. Next, etching back is done until the lower surface 5d of the second trench upper part $5a_1$ is exposed, thereby forming a second gate insulating film upper part $7b_1$ that covers the inner wall side surface of the second trench upper part $5a_1$. Next, the second sacrificial mask 3 is selectively removed.

Next, as shown in FIG. 21, the first trench 8a having a width of 100 nm in the X direction and a depth of 150 nm is formed in the region in which the active region 50 and the first element separation region 51 that were exposed by dry etching. When this is done, the second trench upper part $5a_1$ is additionally etched so that the second trench lower part $5a_2$ having a depth of 150 nm is formed. By doing the above, a second trench 5a is formed that is constituted by the second trench upper part $5a_1$ and the second trench lower part $5a_2$ and that has a depth of 250 nm. The lower surface 5d of the second trench 5a is formed to be 100 nm further to the lower surface side than the lower surface 8d of the first trench 8a. Of the inner wall surfaces of the second trench 5a, only the inner wall surface of the second trench upper part $5a_1$ is covered by the second gate insulating film upper part $7b_1$, and the inner wall surface of the second trench lower part $5a_2$ is in the condition in which the semiconductor substrate 1 is exposed.

Next, as shown in FIG. 22, thermal oxidation is used to oxidize the inner wall surface of the second trench lower part $5a_2$ and the inner wall surface of the first trench 8a. By doing this, a second gate insulating film lower part $7b_2$ made of a silicon oxide film and having a film thickness of 6 nm is formed on the inner wall surface of the second trench lower part $5a_2$. Also, a first gate insulating film 7a made of a silicon oxide film and having a film thickness of 6 nm is formed on the inner wall surface of the first trench 8a. When this thermal oxidation is done, the second gate insulating film upper part $7b_1$ is simultaneously oxidized, the film thickness of the second gate insulating film upper part $7b_1$ increasing to 8 nm. By doing this, of the inner wall surface of the second trench 5a, the second gate insulating film upper part $7b_1$ covers the second trench upper part $5a_1$ (within the range of 150 nm from the upper surface 1b) having a film thickness of 8 nm and the second gate insulating film lower part $7b_2$ covers the second trench lower part $5a_2$ (within the range of 100 nm from the lower surface 5d) having a film thickness of 6 nm.

Next, as shown in FIG. 23 and FIG. 24, after forming the word line 8 and the second element separation region 5, the first impurity diffusion layer 10a and the second impurity diffusion layer 10b, and the first contact plug 11a and the second contact plug 11b, as shown in FIG. 19, the bit lines 12, the second insulating film 13, the third contact plugs 14, the capacitors 15, and the interconnects 16 are sequentially formed, so as to manufacture the semiconductor device 100.

Example 3

As the example 3, the method for manufacturing the semiconductor device 100 of the third embodiment will be described. Parts of the process steps that are the same as noted with regard to the first example will not be described in detail herein.

First, as shown in FIG. 8, the process steps up until the formation of the pattern of the second sacrificial mask 3 are performed in the same manner as in the first embodiment.

Next, as shown in FIG. 26, after forming the second sacrificial mask 3 and the third sacrificial mask 4 on the semiconductor substrate 1, the second sacrificial mask 3 is selectively removed. Next, as shown in FIG. 27, the second sacrificial mask 3 is selectively removed, the active region 50 and the first element separation region 51 being exposed in a linear shape.

Next, as shown in FIG. 28, the exposed active region 50 and first element separation region 51 are etched, the second trench 5a having a width of 55 nm in the X direction and a depth of 150 nm and the first trench 8a having a width of 100 nm in the X direction and a depth of 150 nm are simultaneously formed.

Next, as shown in FIG. 29, using thermal oxidation, the first gate insulating film 7a and the second gate insulating film 7b having a film thickness of 6 nm are formed.

Next, as shown in FIG. 30, the word line 8 and the second element separation region 5 are formed. Also, the upper surface 5c of the conductive layer 5b and the upper surface 8c of the conductive layer 8b are etched back until reaching approximately 50 nm on the lower surface side from the upper surface 1b of the semiconductor substrate 1.

Next, the fourth sacrificial mask 19 made of a silicon nitride film is formed so as to cover the upper surface 5c of the conductive layer 5b, the upper surface 8c of the conductive layer 8b and the third sacrificial mask 4. Next, the fourth sacrificial mask 19 is etched back so as to expose the upper surface 5c of the conductive layer 5b. Next, as shown in FIG. 31, the upper surface 5c of the conductive layer 5b is etched downward 50 nm by etching back using the fourth sacrificial mask 4 as a mask. Next, as shown in FIG. 32, the fourth sacrificial mask 19 is removed so as to expose the upper surface 5c of the conductive layer 5b and the upper surface 8c of the conductive layer 8b.

Next, as shown in FIG. 33, the first insulating film 9 is formed. Next, as shown in FIG. 34, the first impurity diffusion layer 10a and the second impurity diffusion layer 10b are formed. When this is done, the impurity concentration and diffusion conditions are adjusted so that lower surface 10c of the impurity diffusion layers is positioned further to the lower surface side than the upper surface 8c of the conductive layer 8b, and also further to the upper surface side than the upper surface 5c of the conductive layer 5b. The impurity concentration and diffusion conditions are adjusted so that the distance e between the upper surface 5c of the conductive layer 5b and the lower surface 10c of the impurity diffusion layers is at least 20 nm.

Next, the first contact plugs 11a and the second contact plugs 11b, the bit lines 12, the second insulating film 13, the third contact plugs 14, the capacitors 15, and the interconnects 16 are sequentially formed, thereby manufacturing the semiconductor device 100.

Example 4

As the example 4, the method for manufacturing the semiconductor device 100 of the third embodiment will be described. Parts of the process steps that are the same as noted with regard to the first example will not be described in detail herein.

First, as shown in FIG. 15, the process steps up until the formation of the conductive layer 5b and the conductive layer 8b are performed in the same manner as in the first embodiment.

Next, as shown in FIG. 36, the fourth sacrificial mask 19 is formed on the semiconductor substrate 1. Next, the fourth sacrificial mask 19 above the second trench 5a is selectively removed so as to expose the third sacrificial mask 4 and the upper surface 5c of the conductive layer 5b.

Next, the upper surface 5c of the conductive layer 5b is etched downward 50 nm. And, the etching conditions are adjusted so as to make the depth from the upper surface 1b of the semiconductor substrate 1 to the upper surface 5c of the conductive layer 5b buried in the second trench 5a be no greater than 0.8 times the depth from the upper surface 1b of the semiconductor substrate 1 to the lower surface 5d of the second trench 5a. Next, as shown in FIG. 37, the fourth sacrificial mask 19 is removed so as to expose the upper surface 5c of the conductive layer 5b and the upper surface 8c of the conductive layer 8b. Next, as shown in FIG. 38, the first insulating film 9 is formed. Next, CMP is performed to polish the surface of the first insulating film 9 until the third sacrificial mask 4 is exposed.

Next, as shown in FIG. 39, the third sacrificial mask 4 is removed so as to expose the active region 50. Next, the first impurity diffusion layer 10a and the second impurity diffusion layer 10b are formed. When this is done, the impurity concentration and diffusion conditions are adjusted so that lower surface 10c of the impurity diffusion layers is positioned at a position that is at least 20 nm shallower than the upper surface 5c of the conductive layer 5b and also deeper than the upper surface 8c of the conductive layer 8b.

Next, as shown in FIG. 40, the first contact plugs 11a and the second contact plugs 11b are formed. After that, the bit lines 12, the second insulating film 13, the third contact plugs 14, the capacitors 15, and the interconnects 16 are sequentially formed, thereby forming the semiconductor device 100.

As used herein, the following directional terms "forward, rearward, above, downward, vertical, horizontal, below, and transverse" as well as any other similar directional terms refer to those directions of an apparatus equipped with the present invention. Accordingly, these terms, as utilized to describe the present invention should be interpreted relative to an apparatus equipped with the present invention.

Furthermore, the particular features, structures, or characteristics may be combined in any suitable manner in one or more embodiments.

The terms of degree such as "substantially," "about," and "approximately" as used herein mean a reasonable amount of deviation of the modified term such that the end result is not significantly changed. For example, these terms can be construed as including a deviation of at least ±5 percents of the modified term if this deviation would not negate the meaning of the word it modifies.

It is apparent that the present invention is not limited to the above embodiments, but may be modified and changed without departing from the scope and spirit of the invention.

What is claimed is:

1. A semiconductor device comprising:
a semiconductor substrate having an active region and first and second grooves, each of the first and second grooves extending across the active region, the first groove being wider in width than the second groove;
a word line in the first groove, the word line comprising:
a first gate insulating film covering inside walls of the first groove; and
a first conductive film in the first groove, the first conductive film being separated by the first gate insulating film from the semiconductor substrate;
an isolation region in the second groove, the isolation region being narrower in width than the word line and comprising:
a second gate insulating film covering inside walls of the second groove; and
a second conductive film in the second groove, the second conductive film being separated by the second gate insulating film from the semiconductor substrate; and
a diffusion region in the active region, the diffusion region being between the first and second grooves,
wherein the second conductive film is substantially the same in its top surface level as the first conductive film, and
wherein the top surface levels of the first and second conductive film are shallower than a bottom surface level of the diffusion region.

2. The semiconductor device according to claim 1, wherein the first gate insulating film and the second gate insulating film are made of a same insulating material.

3. The semiconductor device according to claim 2, wherein the first conductive film is wider in width than the second conductive film.

4. The semiconductor device according to claim 3, wherein the first and second conductive films are made of the same conductive material.

5. The semiconductor device according to claim 1, wherein the first groove is shallower in depth than the second groove.

6. The semiconductor device according to claim 1, wherein the first gate insulating film and the second gate insulating film have substantially the same thickness as each other.

7. A semiconductor device comprising:
an active region provided in a semiconductor substrate and extended in a first direction;
a first isolation region provided along the active region and extended in the first direction, the first isolation region having a trench filled with an insulator;
a word line region having a first groove extending in a second direction which intersects the first direction;
a second isolation region having a second groove extending in the second direction, the second groove being narrower in a width and deeper in a depth from a surface of the semiconductor substrate than the first groove;
first and second conductive films buried in lower portions of the first and second grooves respectively, each of first and second conductive films extending continuously from the active region to the first isolation region; and
a diffusion region extended downwardly from a surface of the semiconductor substrate and placed between the first and second grooves in the active region, top surfaces of each of the first and second conductive films being located above a bottom surface of the diffusion region and below the surface of the semiconductor substrate.

8. The semiconductor device according to claim 7, wherein the first and second grooves are shallower in a depth from the surface of the semiconductor substrate than that of the trench, respectively.

9. The semiconductor device according to claim 7, further comprising:
a first gate insulating film covering an inside wall of the first groove and isolating the first conductive film from the semiconductor substrate; and
a second gate insulating film covering an inside wall of the second groove and isolating the second conductive film from the semiconductor substrate.

10. The semiconductor device according to claim 7, wherein the top surface of the second conductive film is substantially the same level as that of the first conductive film.

11. The semiconductor device according to claim 10, wherein the first conductive film is wider in a width than the second conductive film.

12. The semiconductor device according to claim 11, wherein the first conductive film comprises the same material as the second conductive film.

13. The semiconductor device according to claim 9, wherein the first gate insulating film comprises the same material as the second gate insulating film.

14. The semiconductor device according to claim 13, wherein the first and second gate insulating films have the same thickness each other.

15. The semiconductor device according to claim 9, further comprising:
a first insulator covering each of the first and second conductive films and burying an upper portion of each of the first and second grooves.

16. The semiconductor device according to claim 15, wherein the first insulating film protrudes from the surface of the semiconductor substrate.

17. The semiconductor device according to claim 16, further comprising:
a contact plug provided between the first isolation films and connected to the diffusion region.

18. A semiconductor device comprising:
an active region provided in a semiconductor substrate and extended in a first direction;
a first isolation region provided along the active region and extended in the first direction,
the first isolation region having a trench filled with an insulator;
a word line region having a first groove extending in a second direction which intersects the first direction;
a second isolation region having a second groove extending in the second direction, the second groove being narrower in a width and deeper in a depth from a surface of the semiconductor substrate than the first groove;
a conductive film buried in a lower portion of each of the first and second grooves, the conductive film extending continuously from the active region to the first isolation region;
a gate insulating film covering an inside wall of each of the first and second grooves and isolating the conductive film from the semiconductor substrate; and
a diffusion region extended downwardly from a surface of the semiconductor substrate and placed between the first and second grooves in the active region, a top surface of conductive film being located above a bottom surface of the diffusion, region and below the surface of the semiconductor substrate.

* * * * *